(12) United States Patent
Tassev

(10) Patent No.: US 11,384,448 B1
(45) Date of Patent: Jul. 12, 2022

(54) OPTIMIZED HETEROEPITAXIAL GROWTH OF SEMICONDUCTORS

(71) Applicant: Government of the United States, as represented by the Secretary of the Air Force, Wright-Patterson AFB, OH (US)

(72) Inventor: Vladimir Tassev, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 31 days.

(21) Appl. No.: 17/118,848

(22) Filed: Dec. 11, 2020

Related U.S. Application Data

(62) Division of application No. 16/201,446, filed on Nov. 27, 2018.

(Continued)

(51) Int. Cl.
*C30B 25/04* (2006.01)
*H01L 21/02* (2006.01)

(Continued)

(52) U.S. Cl.
CPC .............. *C30B 25/04* (2013.01); *C30B 25/18* (2013.01); *C30B 29/406* (2013.01); *C30B 29/42* (2013.01); *C30B 29/44* (2013.01); *C30B 29/48* (2013.01); *G02F 1/3556* (2013.01); *H01L 21/0254* (2013.01); *H01L 21/0262* (2013.01);

(Continued)

(58) Field of Classification Search
CPC ......... C30B 25/18; C30B 25/02; C30B 29/40; C30B 29/44; H01L 21/02461; H01L 21/02543
See application file for complete search history.

(56) References Cited

U.S. PATENT DOCUMENTS 2,916,678 A * 12/1959 Bube ....................... H01L 21/00
148/DIG. 63
4,001,056 A    1/1977 Groves et al.
(Continued)

*Primary Examiner* — Matthew J Song
(74) *Attorney, Agent, or Firm* — AFMCLO/JAZ; Timothy M. Barlow

(57) ABSTRACT

A method of performing heteroepitaxy comprises exposing a substrate to a carrier gas, a first precursor gas, a Group II/III element, and a second precursor gas, to form a heteroepitaxial growth of one of GaAs, AlAs, InAs, GaP, InP, ZnSe, GaSe, CdSe, InSe, ZnTe, CdTe, GaTe, HgTe, GaSb, InSb, AlSb, CdS, GaN, and AlN on the substrate; wherein the substrate comprises one of GaAs, AlAs, InAs, GaP, InP, ZnSe, GaSe, CdSe, InSe, ZnTe, CdTe, GaTe, HgTe, GaSb, InSb, AlSb, CdS, GaN, and AlN; wherein the carrier gas is $H_2$, wherein the first precursor is HCl, the Group II/III element comprises at least one of Zn, Cd, Hg, Al, Ga, and In; and wherein the second precursor is one of $AsH_3$ (arsine), $PH_3$ (phosphine), $H_2Se$ (hydrogen selenide), $H_2Te$ (hydrogen telluride), $SbH_3$ (hydrogen antimonide), $H_2S$ (hydrogen sulfide), and $NH_3$ (ammonia). The process may be an HVPE (hydride vapor phase epitaxy) process.

2 Claims, 22 Drawing Sheets
(22 of 22 Drawing Sheet(s) Filed in Color)

Related U.S. Application Data

(60) Provisional application No. 62/681,155, filed on Jun. 6, 2018.

(51) Int. Cl.

| | |
|---|---|
| *C30B 29/44* | (2006.01) |
| *C30B 29/40* | (2006.01) |
| *C30B 25/18* | (2006.01) |
| *G02F 1/355* | (2006.01) |
| *C30B 29/42* | (2006.01) |
| *C30B 29/48* | (2006.01) |

(52) U.S. Cl.
CPC .. *H01L 21/02293* (2013.01); *H01L 21/02389* (2013.01); *H01L 21/02392* (2013.01); *H01L 21/02395* (2013.01); *H01L 21/02398* (2013.01); *H01L 21/02458* (2013.01); *H01L 21/02461* (2013.01); *H01L 21/02463* (2013.01); *H01L 21/02466* (2013.01); *H01L 21/02505* (2013.01); *H01L 21/02543* (2013.01); *H01L 21/02546* (2013.01); *H01L 21/02549* (2013.01); *G02F 1/3558* (2013.01)

(56) References Cited

U.S. PATENT DOCUMENTS

| | | | |
|---|---|---|---|
| 4,039,357 | A | 8/1977 | Bachmann et al. |
| 4,498,225 | A | 2/1985 | Gutierrez et al. |
| 4,645,683 | A | 2/1987 | Gourrier et al. |
| 4,865,655 | A | 9/1989 | Fujita et al. |
| 5,252,512 | A | 10/1993 | Shuskus et al. |
| 5,311,533 | A | 5/1994 | Stutius et al. |
| 5,868,834 | A * | 2/1999 | Shimoyama ...... C23C 16/45527 117/89 |
| 6,323,053 | B1 * | 11/2001 | Nishikawa .......... H01L 21/0237 257/E21.127 |
| 2008/0110489 | A1 | 5/2008 | Sepehry-Fard |
| 2011/0048537 | A1 * | 3/2011 | Woodall ................ H01L 31/072 257/E29.1 |
| 2015/0187991 | A1 | 7/2015 | McGroddy et al. |
| 2017/0204533 | A1 | 7/2017 | Schunemann et al. |

\* cited by examiner

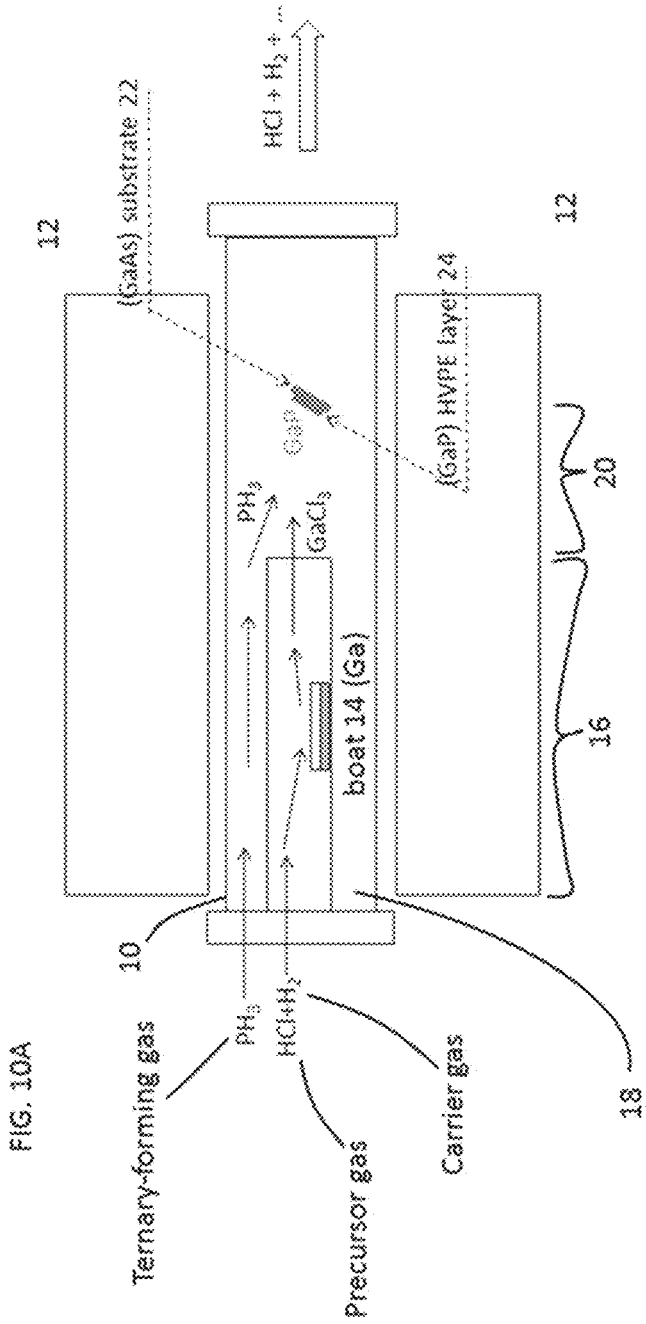

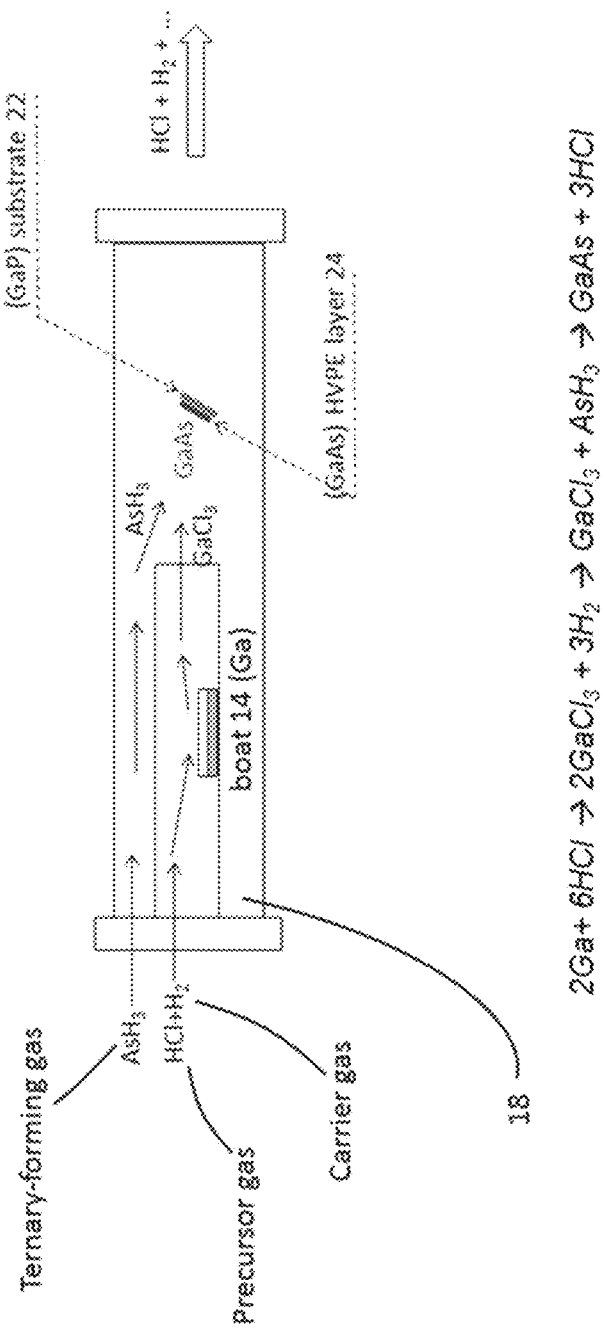

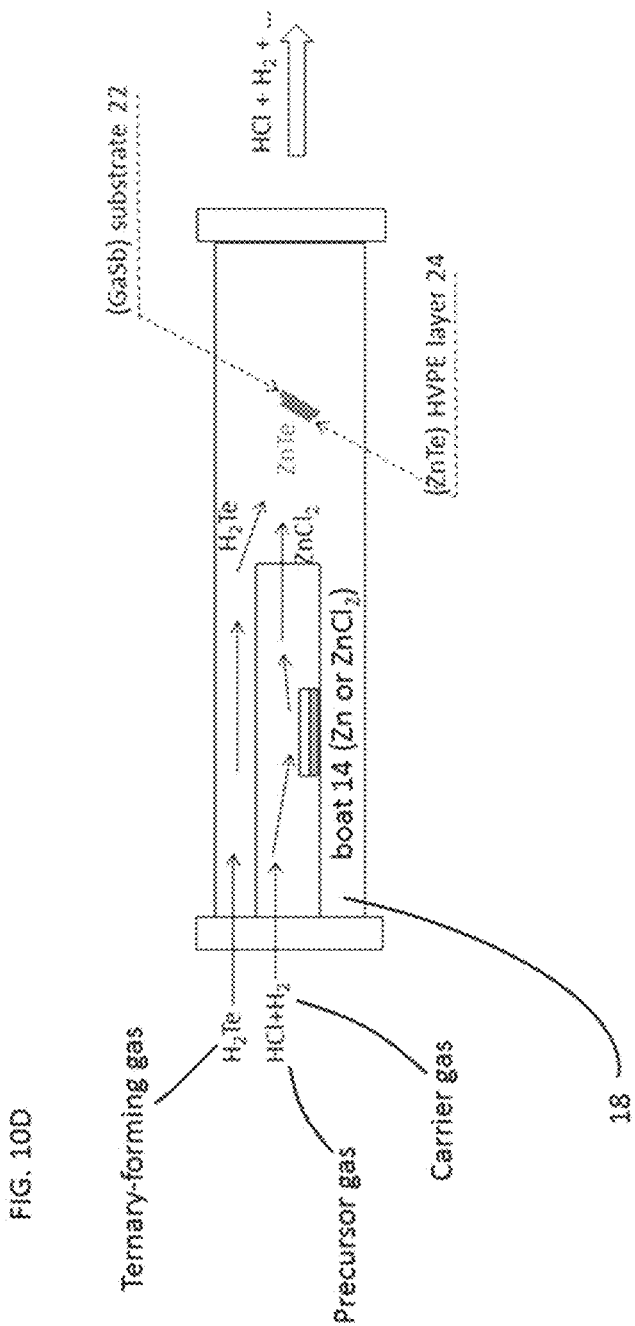

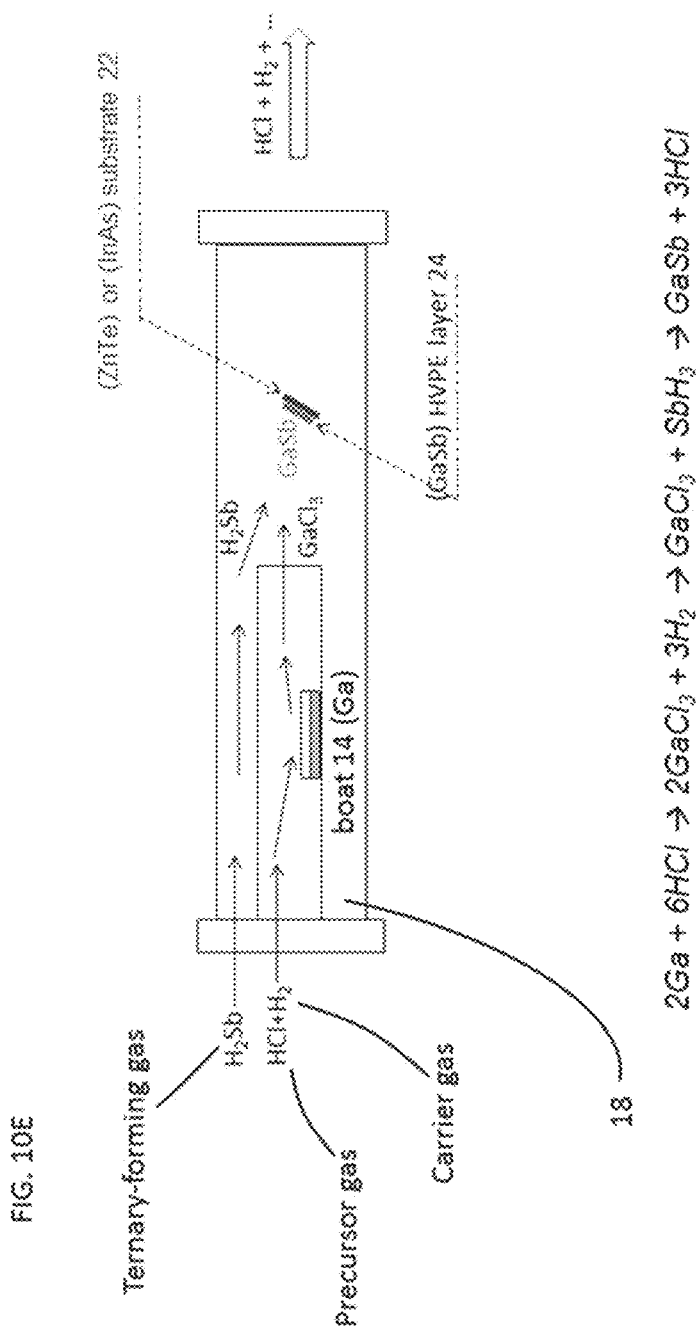

Heteroepitaxy of GaN or AlN on β-GaSe, and GaP on α-GaSe $2Ga + 6HCl \rightarrow 2GaCl_3 + 3H_2 \rightarrow GaCl_3 + NH_3 \rightarrow GaN + 3HCl$
$2Al + 6HCl \rightarrow 2AlCl_3 + 3H_2 \rightarrow AlCl_3 + NH_3 \rightarrow AlN + 3HCl$
$2Ga + 6HCl \rightarrow 2GaCl_3 + 3H_2 \rightarrow GaCl_3 + PH_3 \rightarrow GaP + 3HCl$

FIG. 13

| No | heterojunction | mismatch | precursor 1 | precursor 2 | chemistry |
|---|---|---|---|---|---|
| 1 | GaP/GaAs | -3.574 % | HCl | PH₃ | 2Ga + 6HCl → 2GaCl₃ + 3H₂ , 2GaCl₃ + PH₃ → GaP + 3HCl |
| 2 | GaP/α-GaSe | +0.607 % | HCl | PH₃ | 2Ga + 6HCl → 2GaCl₃ + 3H₂ , 2GaCl₃ + PH₃ → GaP + 3HCl |
| 3 | InP/CdS | +0.624 % | HCl | PH₃ | 2In + 6HCl → 2InCl₃ + 3H₂ , InCl₃ + PH₃ → InP + 3HCl |
| 4 | GaAs/GaP | +3.574 % | HCl | AsH₃ | 2Ga + 6HCl → 2GaCl₃ + 3H₂ , GaCl₃ + AsH₃ → GaAs + 3HCl |
| 5 | AlAs/GaAs | +0.127 % | HCl | AsH₃ | 2Al + 6HCl → 2AlCl₃ + 3H₂ , AlCl₃ + AsH₃ → AlAs + 3HCl |
| 6 | InAs/GaSb | -0.615 % | HCl | AsH₃ | 2In + 6HCl → 2InCl₃ + 3H₂ , InCl₃ + AsH₃ → InAs + 3HCl |
| 7 | ZnSe/GaAs | 0.238 % | HCl | H₂Se | Zn + 2HCl → ZnCl₂ + H₂ , ZnCl₂ + H₂Se → ZnSe + 2HCl |
| 8 | CdSe/InAs | -0.139 % | HCl | H₂Se | Cd + 2HCl → CdCl₂ + H₂ , CdCl₂ + H₂Se → CdSe + 2HCl |
| 9 | α-GaSe/GaP | -0.607 % | HCl | H₂Se | 2Ga + 6HCl → 2GaCl₃ + 3H₂ , 2GaCl₃ + 2H₂Se → 2GaSe + 4HCl + Cl₂ |
| 10 | β-GaSe/GaN | +17.74 % | HCl | H₂Se | 2Ga + 6HCl → 2GaCl₃ + 3H₂ , 2GaCl₃ + 2H₂Se → 2GaSe + 4HCl + Cl₂ |
| 11 | InSe-layered | --- | HCl | H₂Se | 2In + 6HCl → 2InCl₃ + 3H₂ , 2InCl₃ + 2H₂Se → 2InSe + 4HCl + Cl₂ |
| 12 | CdTe/InSb | +0.040 % | HCl | H₂Te | Cd + 2HCl → CdCl₂ + H₂ , CdCl₂ + H₂Se → CdSe + 2HCl |
| 13 | GaTe/InP | -0.100 % | HCl | H₂Te | 2Ga + 6HCl → 2GaCl₃ + 3H₂ , 2GaCl₃ + 2H₂Te → 2GaTe + 4HCl + Cl₂ |
| 14 | HgTe/CdTe | -0.447 % | HCl | H₂Te | 2Hg + 6HCl → 2HgCl₃ + 3H₂ , 2HgCl₃ + 2H₂Te → 2HgTe + 4HCl + Cl₂ |
| 15 | HgTe/InSb | -0.407 % | HCl | H₂Te | 2Hg + 6HCl → 2HgCl₃ + 3H₂ , 2HgCl₃ + 2H₂Te → 2HgTe + 4HCl + Cl₂ |
| 16 | ZnTe/GaSb | +0.083 % | HCl | H₂Te | Zn + 2HCl → ZnCl₂ + H₂ , ZnCl₂ + H₂Te → ZnTe + 2HCl |
| 17 | AlSb/GaSb | +0.650 % | HCl | SbH₃ | 2Al + 6HCl → 2AlCl₃ + 3H₂ , AlCl₃ + SbH₃ → AlSb + 3HCl |
| 18 | InSb/CdTe | -0.040 % | HCl | SbH₃ | 2In + 6HCl → 2InCl₃ + 3H₂ , InCl₃ + SbH₃ → InSb + 3HCl |
| 19 | GaSb/InAs | +0.620 % | HCl | SbH₃ | 2Ga + 6HCl → 2GaCl₃ + 3H₂ , GaCl₃ + SbH₃ → GaSb + 3HCl |
| 20 | AlSb/InAs | +1.273 % | HCl | SbH₃ | 2Al + 6HCl → 2AlCl₃ + 3H₂ , AlCl₃ + SbH₃ → AlSb + 3HCl |
| 21 | CdS/InP | -0.624 % | HCl | H₂S | Cd + 2HCl → CdCl₂ + H₂ , CdCl₂ + H₂S → CdS + 2HCl |
| 22 | GaN/β-GaSe | -17.74 % | HCl | NH₃ | 2Ga + 6HCl → 2GaCl₃ + 3H₂ , GaCl₃ + NH₃ → GaN + 3HCl |
| 23 | AlN/β-GaSe | -17.15% | HCl | NH₃ | 2Al + 6HCl → 2AlCl₃ + 3H₂ , AlCl₃ + NH₃ → AlN + 3HCl |

OPTIMIZED HETEROEPITAXIAL GROWTH OF SEMICONDUCTORS

PRIORITY

Pursuant to 37 C.F.R. § 1.78(a)(4), this application claims the benefit of and priority to prior filed Provisional Application Ser. No. 62/681,155, filed 6 Jun. 2018, and co-pending Non-Provisional application Ser. No. 16/201,446, filed 27 Nov. 2018, each of which are expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to heteroepitaxial growth of semiconductor materials and, more particularly, to a process for thick heteroepitaxial growth, e.g. hundreds of microns thick, of semiconductor materials based on in-situ pre-growth treatment of the substrate.

BACKGROUND OF THE INVENTION

Heteroepitaxy, i.e. the growth of one material on another material, has had a remarkable impact on optics and electronics. It is the first choice and sometimes the only available option when there is lack of a native substrate, e.g. in the cases of gallium nitride (GaN) and aluminum nitride (AlN), which are typically grown on sapphire ($Al_2O_3$) or on silicon carbide (SiC), and in other material cases as well. However, in some cases, even when native substrates are readily available, heteroepitaxy might still be preferable. One convincing example is the numerous attempts to grow different semiconductor materials on silicon (Si).

As a chemical element, Si is widely distributed in nature; silicon is the cheapest and the most common substrate, and has the highest possible material quality. Silicon can be grown conveniently from melt in the shape of large boules (up to 450 mm in diameter) or plates in mature industrial processes such as CZ (Czochralski) and EFG (edge-defined film-fed growth). However, what really makes Si an attractive substrate for heteroepitaxy is its high electrical and thermal conductivity and the possibility to combine it with some optoelectronic materials, e.g. gallium arsenide (GaAs) or gallium phosphide (GaP) and their ternaries and quaternaries. Accordingly, the growth of a number of electronic and optoelectronic materials (including GaAs and GaP) have been attempted on silicon substrates using different growth techniques. Among these growth techniques are well-known industrial techniques such as Molecular Beam Epitaxy (MBE) and Metal Organic Chemical Vapor Deposition (MOCVD), as well as some other less typical approaches, e.g. Remote Plasma-Enhanced Chemical Vapor Deposition (RPECVD) or Liquid Phase Epitaxy (LPE). The opposite cases of growth of silicon on other suitable materials, including GaAs and GaP, have also been investigated.

The most frequent attempts of growth on silicon substrates were performed either directly on the Si-substrate or after the deposition of an intermediate buffer layer (described immediately below), in order to accommodate the growing layer to the foreign substrate (Si), so a great deal of effort has been made in engineering those buffer layers. In some cases when the lattice mismatches between the Si-substrate and the growing layer were really large, for example, in the case of GaAs growth on Si (4.2% lattice mismatch) growth was performed on so-called patterned templates. (Note: Herein, a "substrate" is defined as a plain, ready-for-epitaxial-growth surface, while a "template" is a substrate that has a periodic or aperiodic structure called a "pattern" deposited or otherwise formed on its surface). The pattern on the template is supposed to provide more uniform nucleation on the template surface and more efficient release of the initial strain that results from a large lattice and thermal mismatch between substrate and the growing layer. This technique is reported to work well with other materials even at really large lattice mismatches, such as in the case of the growth of GaSb on patterned GaAs templates (~7% lattice mismatch).

The choice of an alternative substrate material, when possible, avoids the fast oxidation of Si and the subsequent effort to remove the oxide layer. However, with or without surface oxidation, a lot can still be done in each specific case to prepare the substrate surface in a way that will facilitate the initial nucleation that determines the subsequent stages of growth. Prior growth treatment of the foreign substrate and prior growth of a low-temperature (LT) buffer layer, for example, is applied during the growth of GaN on sapphire; it was found helpful to pretreat the sapphire surface with an amount of ammonia ($NH_3$). This process, called "nitridation", aims to convert the sapphire ($Al_2O_3$) surface into AlN (or aluminum nitride), which has a lattice constant that is much closer to the lattice constant of GaN than sapphire. The nitridation process is followed by the deposition of the aforementioned low-temperature (LT) AlN or GaN buffer layer which serves to release the strain built during the initial stage of heteroepitaxy. The next step is the deposition of the intended thick high-temperature (HT) GaN layer.

Next to the lattice mismatch, the thermal mismatch (this is the difference in the thermal expansion coefficients of the substrate and layer materials) is another factor that along with the difference in the thermal conductivity should be taken into account when attempting heteroepitaxial thick-growth because it can result in layer cracking. Due to all these factors, neglecting to some extent the HVPE techniques, research has been focused over the years on using either thin growth techniques such as MOCVD or MBE, or other alternative solutions for achieving thick structures such as, for example, the wafer bonding technique or in some rear cases the PVD technique. All these techniques, of course, have their own disadvantages. Respectively, growths of some other materials, such as ZnSe, GaAs, GaP, GaSb and their ternaries on each other, mostly by MOCVD and MBE, have also been reported. In the particular case of nonlinear optical (NLO) materials such as GaAs, GaP, or ZnSe, when the pursued applications were related to frequency conversion devices, the growth should be performed on orientation-patterned (OP) templates. The pattern on such templates consists of parallel-striped areas (domains) with periodically-alternated crystal polarity. In such cases it is important that the thick HVPE growth is capable of delivering the pattern throughout the whole layer thickness while maintaining good domain fidelity and gaining a large enough aperture for the pump beam that will "ignite" the frequency conversion (FC) processes to propagate. So in this particular case these patterns play a specific optical role and have nothing to do with the patterned templates mentioned above, which aim to facilitate the initial stages of growth in cases when the related mismatches are too large.

In the case of growths on OP-templates, the heteroepitaxial approach is preferred for at least two reasons already mentioned: 1) lack of native OP-templates or 2) other advantages of combining two different material in one quasi-phase matching (QPM) structure—such advantages could be the better quality and/or the lower market price of the wafers, the availability of closely-matching non-native OP templates, a more mature growth process, etc. Due to the first reason, PVD layer growth (PVD is more known as a bulk growth technique) of OPZnSe has been performed on OPGaAs templates with a great deal of confidence, because of the small lattice mismatch (+0.24%) between ZnSe and GaAs. More timid attempts were made to grow thick GaP on plain GaAs substrates and OPGaP on OPGaAs templates without much hope for success due to the larger lattice mismatch between GaAs and GaP (−3.57%). Surprisingly, while the first work yielded relatively poor domain fidelity and, as a consequence, limited optical results, the results from the second attempt were rather encouraging, especially when the growth was performed on plain GaAs substrates.

Unfortunately, at this time the resulting layers were not thick enough for a practical frequency conversion demonstration. Thus OPGaP/OPGaAs heteroepitaxy was neglected for several more years, and research returned to homoepitaxy of OPGaP/OPGaP. However, the preparation of OPGaP templates for the OPGaP/OPGaP homoepitaxy revealed some significant shortcomings. Such shortcomings include the low quality (poor parallelism and high etch pit density) and high price of available GaP wafers, the presence of an additional absorption band in the IR between 2 and 4 µm, the absence of an etch-stop material (needed to secure the thickness of the inverted layer during the preparation of OP-templates by the wafer-bonded techniques), etc. As a consequence, using such wafers for the fabrication of OP-templates unavoidably resulted in the same poor OPGaP template quality and, subsequently, in poor HVPE growths on them. Thus the idea to use the 8-10 times cheaper but much higher-quality OPGaAs templates, which had been fabricated routinely for a number of years for OPGaAs/OPGaAs homoepitaxy, came back to the stage again—this time in support of the OPGaP/OPGaAs heteroepitaxy. As a consequence, after making some suitable changes in the reactor configuration and the growth chemistry excellent domain fidelity were repeatedly grown on OPGaAs templates.

Accordingly, the previous work leaves much to be desired with regard to heteroepitaxial thick growth opportunities. At this point, development in many areas of optics and electronics appeared to be almost to their limits, but a lot of unexplored potential remains for HVPE heteroepitaxy through further engineering of the buffer layer or through other less-explored approaches, especially in the cases of larger lattice and thermal mismatches between the substrate and the growing layer. Some examples: (i) in optoelectronics: proper combinations of electronic with optoelectronic materials realized by heteroepitaxy may take over other less efficient approaches, e.g. bonding or PVD. This can result in further miniaturization of ultrafast all-optically communicating processors and other devices; (ii) in the solar cell industry: even though Si can be grown easily in mature processes, e.g. CZ and EFG, and is still considered as an indisputable leader among the rest of the "solar" materials, there are many material limitations that restrict the efficiency of the Si-solar cells. In this case, some optimized heteroepitaxial approaches for the growth of other materials on Si may lead to small-dimension, high-power, broad-band hybrid solar cells suitable for various unachieved applications; (iii) multi-material heterostructures can also favor development of multi-color detectors that could cover a wide range of the spectrum; (iv) in the field of development of new laser sources: heteroepitaxy may allow growths of phase matching materials (including of such that have never been grown practically in large monocrystalline substrates) or quasi-phase matching structures and the design of high power, broadly tunable frequency conversion devices. Such devices could easily achieve new frequency ranges resulting in various new applications in areas such as defense, security, industry, science, and medicine.

The mechanisms of crystal growth are complex. On a practical level, it is difficult to determine on an atomic scale what exactly occurs after only the first few monolayers of growth, even in the simplest cases of homoepitaxy of plain semiconductor materials, e.g. Si and Ge. Obviously, heteroepitaxy is a more complex event. This is the real reason why the semiconductor industry has adopted only a few techniques for slow, thin growth, e.g. MOCVD and MBE, and for only a few well-studied materials. This is also the reason why thick growth approaches, e.g. HVPE, are used in only a limited number of homo- and heteroepitaxial cases. In reality, HVPE has never been accepted as a "full" member of the industrial family. This is because HVPE and the other thick growth techniques also have their own problems. An example of such problems is that in most cases, thick HVPE growth requires a two-step process—first to deposit on the substrate a thin MOCVD or MBE buffer layer or, to first deposit a LT low-quality HVPE buffer layer.

SUMMARY OF THE INVENTION

The present invention overcomes the foregoing problems and other shortcomings, drawbacks, and challenges of heteroepitaxial growth of semiconductor materials. While the invention will be described in connection with certain embodiments, it will be understood that the invention is not limited to these embodiments. To the contrary, this invention includes all alternatives, modifications, and equivalents as may be included within the spirit and scope of the present invention.

The inventive one-step thick HVPE growth process is preceded by an in-situ pre-growth treatment of the substrate, disclosed and explained below, and is supported by results that confirm that this approach ensures a smooth transition between the growing layer and the foreign substrates in many material cases, while avoiding other steps with unfavorable impacts on the quality of the growing layer. The disclosed process demonstrates that in many cases heteroepitaxy could be the better choice nevertheless that in some cases homoepitaxy is possible. Thus, based on the results presented below it is suggested that the common belief that homoepitaxy is always preferable over heteroepitaxy should be reconsidered.

Due to the complex chemistry and specific growth issues for each material, HVPE is not a traditional industrial technique such as MOCVD and MBE. However, it is the only known approach (excluding wafer bonding or to a small extend the Physical Vapor Deposition (PVD) technique) capable of providing layers hundreds of microns thick needed for the application discussed below. However, due the nature of its fast growth and, as a result, poor control of the initial stage of growth, HVPE should often be combined with either growth on patterned templates, or deposition first of a low or high temperature intermediate buffer layer, which could be with gradually changing composition. As a close-to-equilibrium process, HVPE could be also combined with a far-from-equilibrium technique such as MOCVD or MBE. In contrast to HVPE, such techniques by providing high supersaturation conditions can be used to deposit on the substrate first an initial thin layer from the same or even other (better matching) material in many cases when HVPE cannot do that. At this point one should bear in mind that there are some significant differences between the MBE (or MOCVD) and the HVPE buffer layers—the first ones are much thinner (30-370 nm) than the second ones which could achieve 3-5 μm thickness or more. In addition, while the MBE (or MOCVD) layers are in most of the cases from the same material and are used mostly for reducing the initial mismatch strain, the HVPE layers can be from the same or different than the parenting (the growing and the substrate) materials and can be used more efficiently rather to fit the substrate to the growing material by gradually changing their composition over the layer thickness. In this point of view the definition for "changing the composition" of the buffer layer may have two different meanings. For example, if we grow a low temperature (LT) GaN buffer layer to prepare the sapphire substrate for the real high temperature (HT) GaN growth, under "changing the composition" we have in mind changing the V-III ratio during the buffer layer growth. The situation is completely different during heteroepitaxy when we try to grow, for example GaP on a GaAs substrate. Than we change the composition of the buffer layer with increasing the phosphorus content on the expense of the arsine content, so in this case the buffer layer is a $GaAs_xP_{1-x}$ ternary with gradually changing composition.

According to one embodiment of the present invention a method of performing heteroepitaxy, comprises exposing a substrate exposing a substrate to a carrier gas, a first precursor gas, a Group II/III element, and a second precursor gas, to form a heteroepitaxial growth of one of GaAs, AlAs, InAs, GaP, InP, ZnSe, GaSe, CdSe, InSe, ZnTe, CdTe, GaTe, HgTe, GaSb, InSb, AlSb, CdS, GaN, and AlN on the substrate; wherein the substrate comprises one of GaAs, AlAs, InAs, GaP, InP, ZnSe, GaSe, CdSe, InSe, ZnTe, CdTe, GaTe, HgTe, GaSb, InSb, AlSb, CdS, GaN, and AlN; wherein the carrier gas is $H_2$, wherein the first precursor is HCl, the Group II/III element comprises at least one of Zn, Cd, Hg, Al, Ga, and In; and wherein the second precursor is one of $AsH_3$ (arsine), $PH_3$ (phosphine), $H_2Se$ (hydrogen selenide), $H_2Te$ (hydrogen telluride), $SbH_3$ (hydrogen antimonide), $H_2S$ (hydrogen sulfide), and $NH_3$ (ammonia). The process may be an HVPE (hydride vapor phase epitaxy) process. More than one second precursor may be used, in varying ratios.

According to a first variation of the invention, the substrate is GaAs (gallium arsenide), the second precursor is $PH_3$ (phosphine), and the heteroepitaxial growth is GaP (gallium phosphide).

According to another variation of the invention, the substrate is GaP (gallium phosphide), the second precursor is $AsH_3$ (arsine), and the heteroepitaxial growth is GaAs (gallium arsenide).

According to a further variation of the invention, the substrate is GaAs (gallium arsenide), the second precursor is $H_2Se$ (hydrogen selenide), and the heteroepitaxial growth is ZnSe (zinc selenide).

According to another variation of the invention, the substrate is ZnSe (zinc selenide), the second precursor is $AsH_3$ (arsine), and the heteroepitaxial growth is GaAs (gallium arsenide).

According to another variation of the invention, the substrate is GaSb (gallium antimonide), the second precursor is $H_2Te$ (hydrogen telluride), and the heteroepitaxial growth is ZnTe (zinc telluride).

According to a further variation of the invention, the substrate is ZnTe (zinc telluride), the second precursor is $SbH_3$ (antimony trihydride, called also stibine), and the heteroepitaxial growth is GaSb (gallium antimonide).

According to a further variation of the invention, the substrate is GaN (gallium nitride), the second precursor is $H_2Se$ (hydrogen selenide), and the heteroepitaxial growth is β-GaSe (gallium selenide).

According to another variation of the invention, the substrate is β-GaSe (gallium selenide), the second precursor is $NH_3$ (ammonia), and the heteroepitaxial growth is GaN (gallium nitride).

According to a further variation of the invention, the substrate is GaP (gallium phosphide), the second precursor is $H_2Se$ (hydrogen selenide), and the heteroepitaxial growth is α-GaSe (gallium selenide).

According to a further variation of the invention, the substrate is α-GaSe (gallium selenide), the second precursor is $PH_3$ (phosphine), and the heteroepitaxial growth is GaP (gallium phosphide).

According to another variation of the invention, the substrate is AlN (aluminum nitride), the second precursor is $H_2Se$ (hydrogen selenide), and the heteroepitaxial growth is β-GaSe (gallium selenide).

According to a further variation of the invention, the substrate is β-GaSe (gallium selenide), the second precursor is $NH_3$ (ammonia), and the heteroepitaxial growth is AlN (aluminum nitride).

According to a further variation of the invention, the substrate is GaAs (gallium arsenide), the second precursor is $AsH_3$ (arsine), and the heteroepitaxial growth is AlAs (aluminum arsenide).

According to another variation of the invention, the substrate is GaSb (gallium antimonide), the second precursor is $AsH_3$ (arsine), and the heteroepitaxial growth is InAs (indium arsenide).

According to another variation of the invention, the substrate is CdS (cadmium sulfide), the second precursor is $PH_3$ (phosphine), and the heteroepitaxial growth is InP (indium phosphide).

According to another variation of the invention, the substrate is InAs (indium arsenide), the second precursor is $H_2Se$ (hydrogen selenide), and the heteroepitaxial growth is CdSe (cadmium selenide).

According to another variation of the invention, the substrate is InSb (indium antimonide), the second precursor is $H_2Te$ (hydrogen telluride), and the heteroepitaxial growth is CdTe (cadmium telluride).

According to another variation of the invention, the substrate is InP (cadmium telluride), the second precursor is $H_2Te$ (hydrogen telluride), and the heteroepitaxial growth is GaTe (gallium telluride).

According to another variation of the invention, the substrate is CdTe (indium phosphide), the second precursor is $H_2Te$ (hydrogen telluride), and the heteroepitaxial growth is HgTe (gallium telluride).

According to another variation of the invention, the substrate is InSb (indium antimonide), the second precursor is $H_2Te$ (hydrogen telluride), and the heteroepitaxial growth is HgTe (gallium telluride).

According to another variation of the invention, the substrate is GaSb (gallium antimonide), the second precursor is $SbH_3$ (antimony trihydride), and the heteroepitaxial growth is AlSb (aluminum antimonide).

According to another variation of the invention, the substrate is CdTe (cadmium telluride), the second precursor is SbH$_3$ (antimony trihydride), and the heteroepitaxial growth is InSb (indium antimonide).

According to another variation of the invention, the substrate is InAs (indium arsenide), the second precursor is SbH$_3$ (antimony trihydride), and the heteroepitaxial growth is GaSb (gallium antimonide).

According to another variation of the invention, the substrate is InAs (indium arsenide), the second precursor is SbH$_3$ (antimony trihydride), and the heteroepitaxial growth is AlSb (aluminum antimonide).

According to another variation of the invention, the substrate is InP (indium phosphide), the second precursor is H$_2$S (hydrogen sulfide), and the heteroepitaxial growth is CdS (cadmium sulfide).

Details regarding other heteroepitaxial cases can be found in FIG. 13.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

(FIG. 9A) Before preheating; (FIG. 9B); After preheating in PH$_3$:H$_2$ atmosphere; (FIGS. 9C and 9D); Areas from (FIG. 9B) present an increasing magnification, showing how the longitudinally-shaped pits in the opposite domains are oriented in two mutually perpendicular directions; and (FIG. 9E) presents a Nomarski cross section image of a 138 μm thick OPGaP grown heteroepitaxially on an OPGaAs template, according to an embodiment of the invention;

FIG. 10A illustrates a schematic drawing of an HVPE apparatus for optimized thick heteroepitaxial growth of GaP with in-situ pre-growth treatment of the GaAs substrate or the template, according to an embodiment of the invention;

FIG. 10B illustrates a schematic drawing of an HVPE apparatus for optimized thick heteroepitaxial growth of GaAs with in-situ pre-growth treatment of the GaP substrate or the template, according to an embodiment of the invention;

FIG. 10D illustrates a schematic drawing of an HVPE apparatus for optimized thick heteroepitaxial growth of ZnTe with in-situ pre-growth treatment of the GaSb substrate or the template, according to an embodiment of the invention;

FIG. 10E illustrates a schematic drawing of an HVPE apparatus for optimized thick heteroepitaxial growth of GaSb with in-situ pre-growth treatment of the ZnTe substrate or the template, according to an embodiment of the invention;

FIG. 13 presents a number of suitable heteroepitaxial cases.

Figure 1:
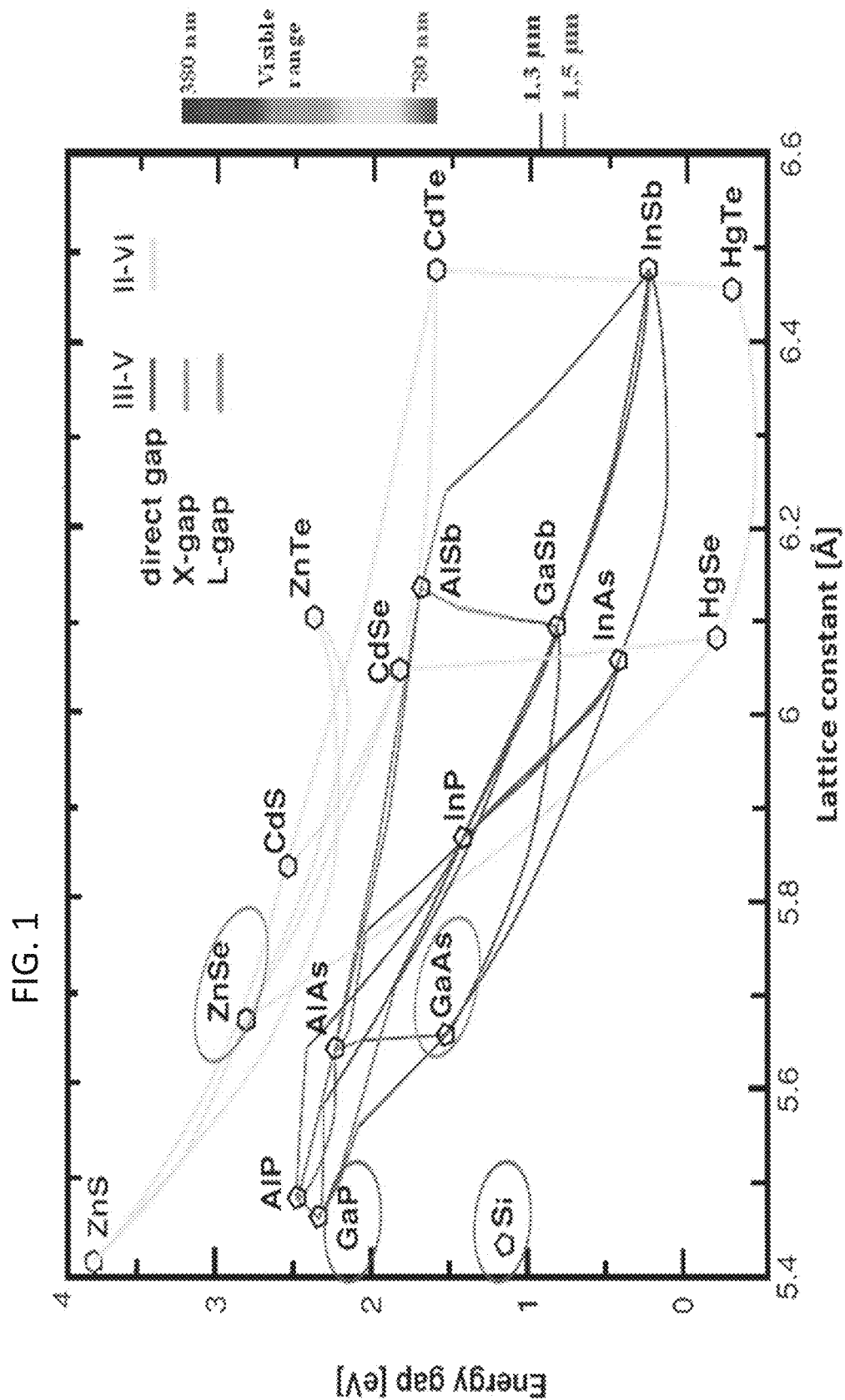
FIG. 1 illustrates the energy gap as a function of the lattice constants for some traditional compound semiconductor materials.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

A process for thick heteroepitaxial growth of semiconductor materials is presented below. The semiconductor structures of the growing layer(s) may be deposited in a horizontal or vertical direction, on plain substrates or on patterned templates, including orientation-patterned templates.

A further embodiment of the invention states that the heteroepitaxial growth is preceded by an in-situ pre-growth treatment of the substrate or the template followed by at least 300-500 μm thick heteroepitaxial growth of one or more doped or undoped semiconductor materials or their binaries, ternaries, or quaternaries.

In order to be successful, each separate heteroepitaxial combination must meet particular requirements, including the lattice mismatch and the accumulated strain. Accordingly, the heteroepitaxy exhibited in any particular example below will be based on the degree and the sign of the lattice mismatch between substrate and growing layer, as well as on how the strain accumulated in the growing layer as a result of the lattice and thermal mismatch is released—in plastic or elastic strain release processes. An example of such a process is the periodic formation of the so-called "misfit dislocations" (MDs). Such dislocations may appear after a certain critical thickness $h_c$ of the so-called "pseudomorphous growth" during which the layer is "forced" to grow with the lattice constant of the substrate. (Note: The words "mismatch" and "misfit" are almost identical, but their meanings are distinct in this context. However, in particular cases, one will be preferred to the other. For example, it is proper to say "lattice mismatch" and "misfit dislocations".) In this invention we teach that the sign and the degree of the lattice mismatch and the periodicity of the MDs may be used as criteria for one to determine how successful a new case of heteroepitaxy could be.

The lattice mismatch f % is calculated using the formula:

$$f\% = (b_0 - a_0)/a_0 \; 0.100 \tag{eq. 1}$$

where $a_0$ and $b_0$ are the lattice constants of the substrate and the layer material. The lattice constants of some traditional semiconductor materials are presented in FIG. 1, which shows their bandgap energies as a function of their lattice constants. From FIG. 1, one can easily see that some materials, although having different bandgap energies, have close lattice constants and could be suitable for heteroepitaxy. Such are, for example, GaP and Si, GaAs and ZnSe, AlAs and GaAs, etc.

The periodicity r of the misfit dislocations is determined by:

$$\tau = 100/f\% \tag{eq. 2}$$

As an example, we can determine the lattice mismatch f % and the periodicity of the MDs τ in the particular heteroepitaxial case of growth of GaP on a GaAs substrate. The lattice constant ($a_0$) of GaAs=5.6532 Å, while the lattice constant ($b_0$) of GaP=5.4512 Å. According to equations (1) and (2), in this example the lattice mismatch ($f_a$) is negative (−3.57%) because $b_0$ GaP<$a_0$ GaAs; we should expect the appearance of MDs at a periodicity τ of about 28 (i.e. 100/3.57) interatomic distances.

Such lattice mismatch (−3.57%) may be considered as large. Lattice mismatches of 3-4% and more are, in general, considered as relatively large, while lattice mismatches under 1% may be considered as relatively small. Thus the lattice mismatch between GaP and GaAs (−3.57%) may be considered as large, while the lattice mismatch between ZnSe and GaAs (+0.26), for example, may be considered as small. However, whether a particular mismatch can be considered as large or small depends on other factors as well, for example, on the strength of the bonds (the bond dissociation energies)—between the atoms of the substrate and those of the growing layer. For example (Table 1) the bond energies of the bonds Ga—As and Ga—P are in the same order of magnitude, which means that the As and P atoms can easily replace each other. That is why GaAs and GaP substrates can be pre-treated easily—thus they can easily grow one on another. As Table 1 also shows, in this point of view GaSb, InSb and InP are also "easy" substrates due to the low bonding energies of their atoms. However, as one can see from Table 1, due to the high bonding energy of the Ge—Ge bonds and, especially, of the Si—Si bonds, these common substrates are hardly treatable. Thus, in the case of growth of Ge/Se, for example, namely because the atomic bonds are strong in both materials, the lattice mismatch of +3.96% between Ge and Si is considered as huge, no matter that as a number this mismatch is not much different from the lattice mismatch between GaAs and GaP:

TABLE 1

Some bond dissociation energies
(standard state enthalpy changes) at T = 298K.

| Bond | Bond dissociation energy $\Delta Hf_{298}$ [kJ/mol] |
|---|---|
| Ga—As | 209 |
| Ga—P | 230 |
| Ga—Sb | 209 |
| In—Sb | 152 |
| In—P | 198 |
| Ge—Ge | 274 |
| Si—Si | 327 |

The sign of the lattice mismatch, minus (−) or plus (+), is also important. For example, it was determined that the thickness of the pseudomorphous growth, i.e. the critical thickness $h_c$, is larger when the lattice mismatch is negative and the film is growing during the pseudomorphous growth under tensile strain (because the layer has a smaller lattice constant than the substrate) than in the case of a positive lattice mismatch when the layer is growing compressively strained. The significant difference in the mechanisms of dislocation nucleation (after the moment in which the pseudomorphous growth becomes energetically unfavorable and the accumulated elastic strain must be relieved somehow) in the case of tension vs. compression contributes to this difference as well. For example, while in the compression case the dislocations nucleate by squeezing out an atom at the base of surface depressions, in the tension case, the nucleation of misfit dislocations involves the concerted motion of a relatively large number of atoms, leading to insertion of an extra lattice (plane) row into an already continuous film. In addition to all that the film morphology depends intimately on the sign of the misfit (+ or −), i.e., on type of the strain (tensile or compressive). It is experimentally confirmed, for example, that growth under tensile strain (negative misfit) favors 2D growth which usually results in smooth surface morphology, while compressive growth facilitates 3D growth which typically results in hillock type, rougher surface morphology. This supports again the notion that the growth under tensile strain, as it is in the case of growth of GaP on GaAs, should be more favorable than, for example, the opposite case of growth of GaAs on GaP, or in other cases with positive misfits.

Figures 2A, 2B:
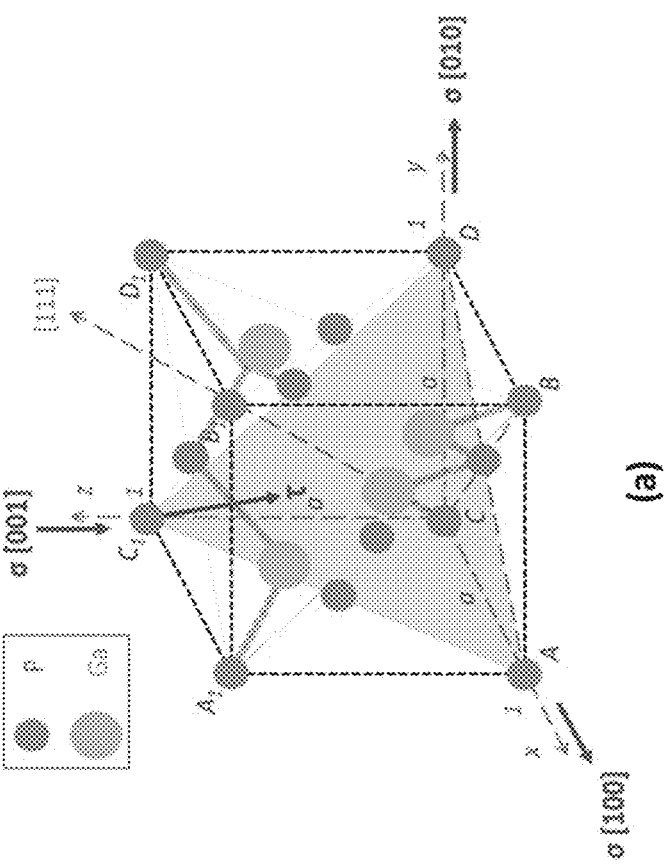
FIG. 2A illustrates that the biaxial strain a can be resolved into a uniaxial shear stress τ on the {111} dislocation glide plane.
FIG. 2B presents a TEM image of the strain being relaxed in a plastic (dislocation nucleation) process during GaP/GaAs heteroepitaxy.

The linearly-increasing elastic strain accumulated during the pseudomorphous growth must be released at a certain point. The formation of MDs is one of the possible mechanisms of strain relief. However, deeper crystallographic considerations are necessary to determine where they should be expected, or on which crystallographic plane it is most probable for the MDs to appear. In a zinc blended structure (i.e. this is the structure of many of the compound semiconductor materials presented herein, e.g. GaAs, GaP, ZnSe, etc.), for example, the biaxial strain a accumulated during pseudomorphous growth can be resolved (see FIG. 2A) into a uniaxial shear stress τ on the (111) dislocation glide plane. At the same time, the directions of σ and τ, of course, will be opposite depending on whether the layer is growing under tensile (negative mismatch) or compressive (positive mismatch) strain. In other words, whether the lattice constant of the growing layer is smaller or larger than the lattice constant of the substrate. Thus, recalling that the accumulated strain may be released in either elastic (surface roughening) or plastic (dislocation nucleation) relaxation processes, one may assume that in the latter case the most probable plane where the misfit dislocations shall appear is (111). Such dislocations were indeed noticed in the (111) zone in the particular case of GaP/GaAs heteroepitaxy as the TEM image in FIG. 2B indicates.

On the other hand, other distortions such as the formation of voids or the roughening of surfaces, for example roughening of the growing interface, may also contribute in absorbing the accumulated elastic energy as alternative strain relief mechanisms that may postpone the formation of the MDs until a later stage of growth. All this provided some insight that it might not be terribly detrimental if the surface of the substrate was to be made rougher with the intention of facilitating the initial layer's nucleation.

Roughening of the surface may be the result of exposing the substrate to a non-native precursor during the preheating stage. This is supported by FIGS. 3C-3D which present an SEM image (FIG. 3C) and an AFM image (FIG. 3D) from the image on FIG. 3C of a GaAs substrate preheated for 1 h in a $PH_3$:$H_2$ atmosphere. The damages (not shown) are about the same after preheating the GaAs substrate for 1 hour in $AsH_3$:$H_2$ atmosphere, and exposed after that to $PH_3$:$H_2$ for only 1 minute).

Figure 3B:
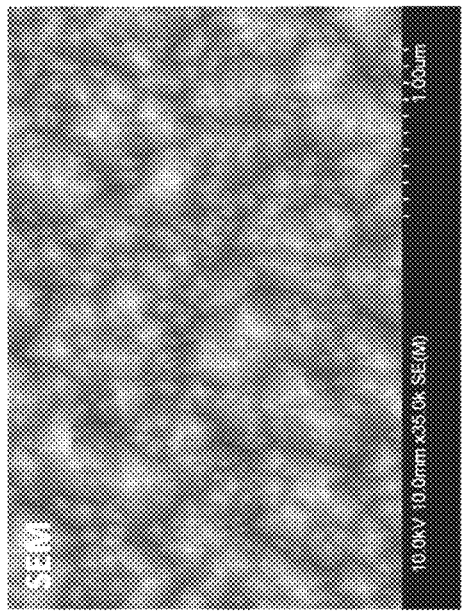
FIG. 3B presents an SEM image of a GaAs substrate preheated in H$_2$ atmosphere only and shows the damages in result of the thermal decomposition of the GaAs surface.
Figure 3D:
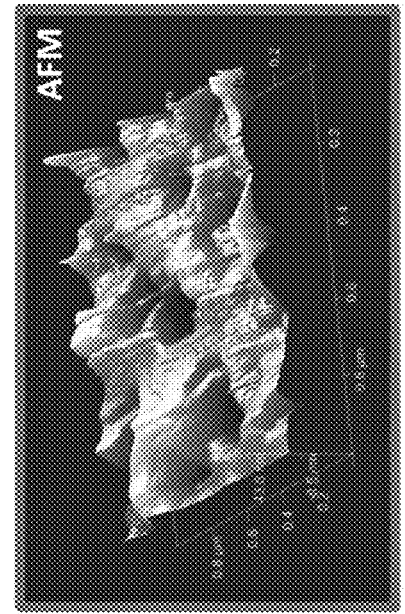
FIG. 3D presents an AFM images of a small area from the SEM image shown on FIG. 3C.
Figure 3A:
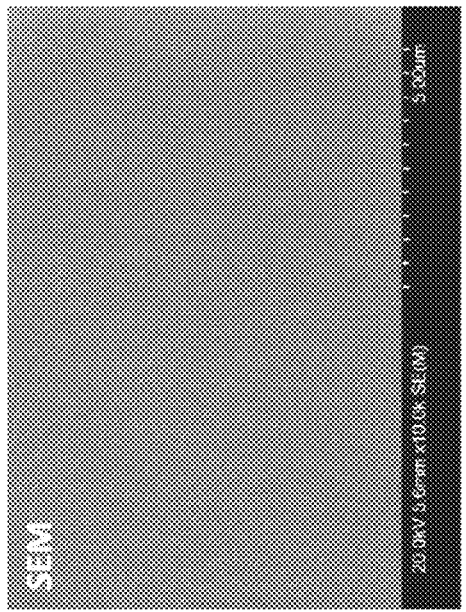
FIG. 3A presents an SEM image of a GaAs substrate preheated for 1 h in AsH$_3$+H$_2$ atmosphere, according to an embodiment of the invention.
Figure 3C:
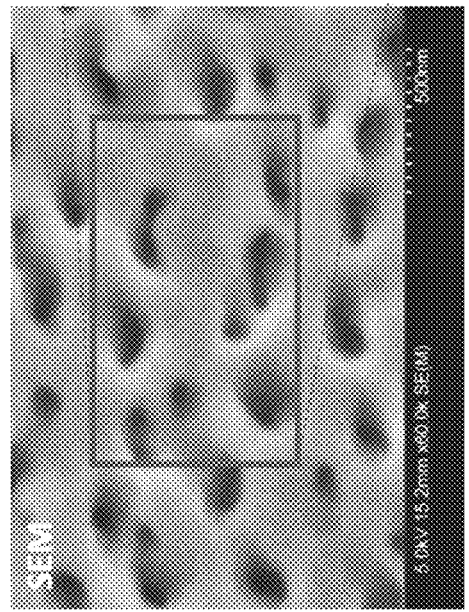
FIG. 3C presents a SEM image with a higher magnification of a GaAs substrate preheated for 1 h in PH$_3$:H$_2$ atmosphere.

FIG. 3A presents an SEM image of a GaAs substrate preheated for 1 h in $AsH_3$+$H_2$ atmosphere, according to an embodiment of the invention; one can see that such roughening (see FIGS. 3C-3D) never occurs when the substrate is exposed to its native precursor (see FIG. 3A) during the preheating stage. However, although this temperature is still lower than the deposition temperature, some thermal decomposition of the substrate may occur if the GaAs substrate is preheated only in an $H_2$ atmosphere, as shown in FIG. 3B. For example, to prevent the thermal decomposition during growths of GaAs or GaP the wafers should to be exposed to an $AsH_3$:$H_2$ (the GaAs wafer) or a $PH_3$:$H_2$ (the GaP wafer) mixture once the furnace temperature achieves 350-400° C., even though the decomposition temperature is much higher—about 700° C. Preheating the substrate only in $H_2$, for example, actually results in an intensive evaporation (and shortage) of the more volatile group V-atom (As or P in the particular cases of GaAs or GaP) (see FIG. 3B). Going further in this direction by pretreating the GaAs substrate in phosphine ($PH_3$), or in a $PH_3$:$H_2$ mixture, leads to severe pitting of the GaAs surface (see FIGS. 3C, 3D, 4A, and 4C). Similarly, preheating the GaP substrate in $AsH_3$ or in an $AsH_3$:$H_2$ mixture resulted even in more severe pitting of the GaP surface (see FIG. 4B and FIG. 4D). Even with the time of exposure as short as 1 minute, the visible surface damages on the substrate's surface will be about the same as after one hour of exposure of the substrate to the nonnative precursor (as shown in FIGS. 3C-3D and 4A-4D).

Figure 4B:
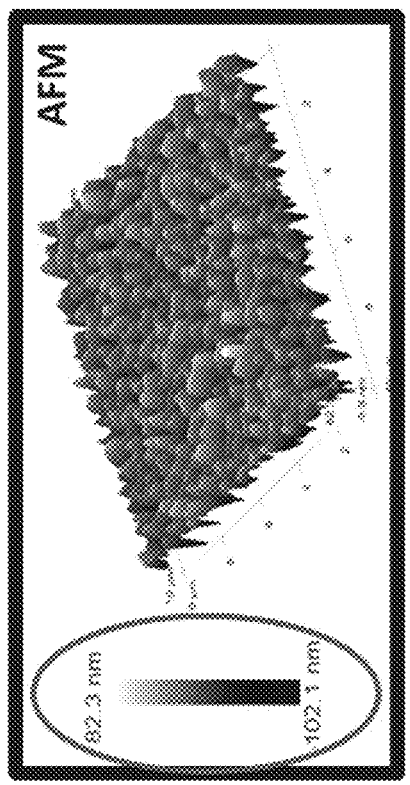
FIG. 4B presents an AFM image at lower magnification of a GaP substrate preheated for 1 h in AsH$_3$:H$_2$ atmosphere, according to an embodiment of the invention.
Figure 4D:
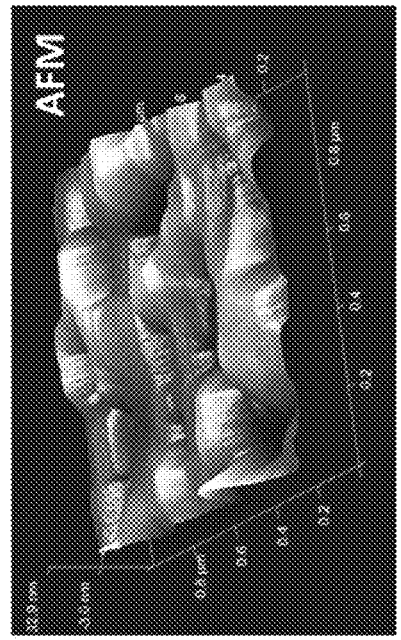
FIG. 4D presents an AFM image of a small area of FIG. 4B at a higher magnification of a GaP substrate preheated for 1 h in AsH$_3$:H$_2$ atmosphere, according to an embodiment of the invention.
Figure 4A:
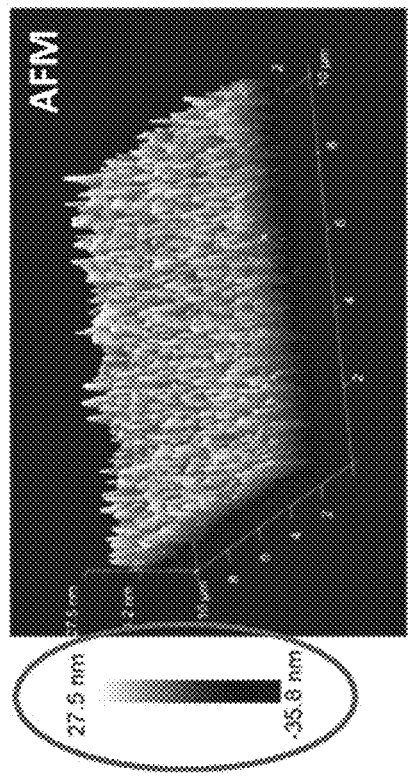
FIG. 4A presents an AFM image at lower magnification than FIGS. 3A-3D of a GaAs substrate preheated for 1 h in PH$_3$:H$_2$ atmosphere, according to an embodiment of the invention.
Figure 4C:
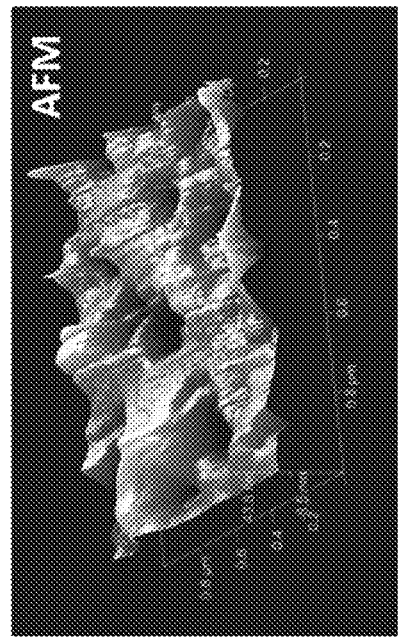
FIG. 4C presents an AFM image of a small area of FIG. 4A at a higher magnification of a GaAs substrate preheated for 1 h in PH$_3$:H$_2$ atmosphere, according to an embodiment of the invention.
Figure 5:
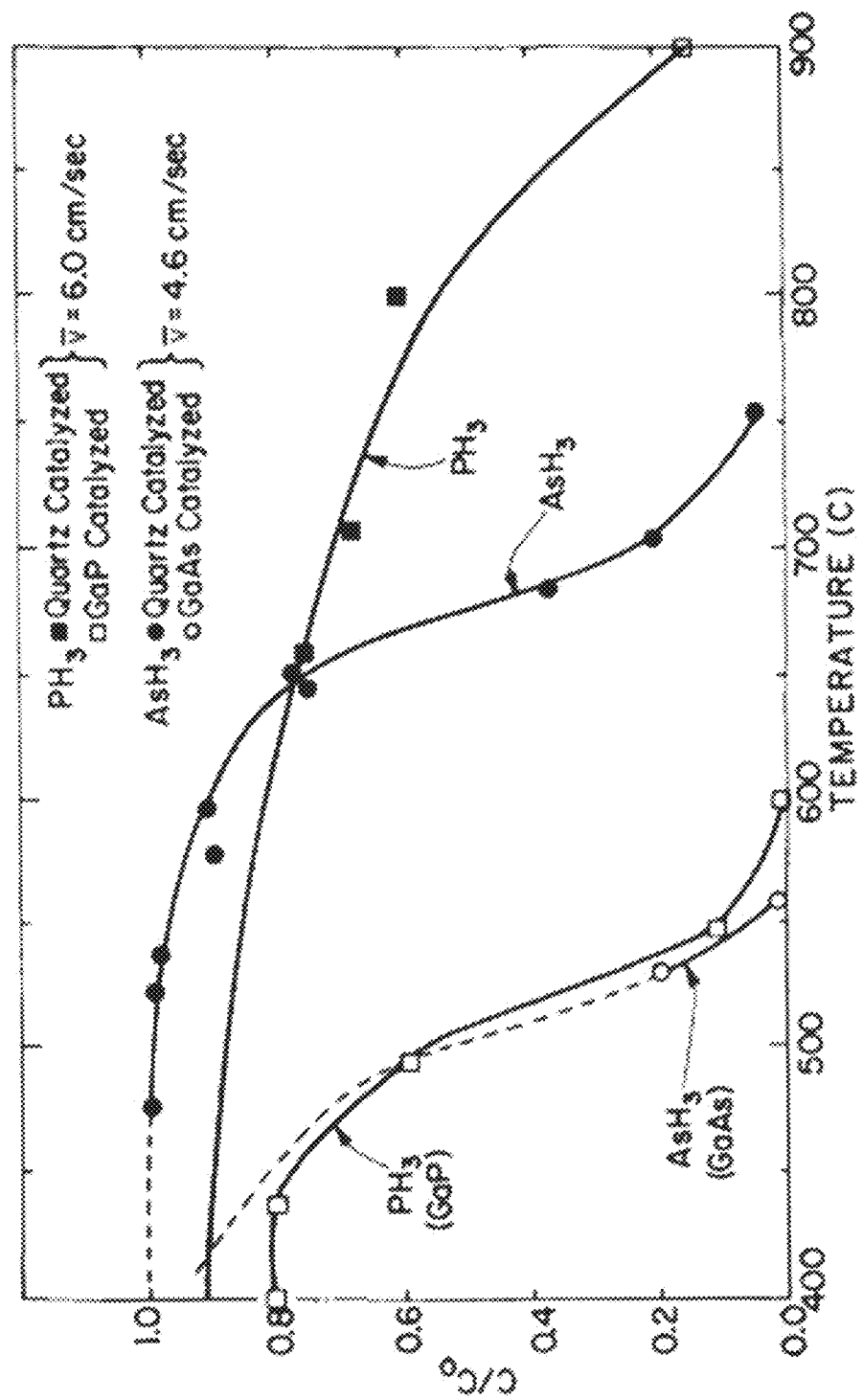
FIG. 5 presents the thermal decomposition of AsH$_3$ and PH$_3$ as a function of the temperature in a quartz vessel with (the two curves at left) and without (the two curves at right) the presence of a GaAs (with arsine) or a GaP (with phosphine) substrates within the vessel.

It is thought that the stronger influence of $AsH_3$ on GaP than of $PH_3$ on GaAs (compare the ranges of the distances between peaks and valleys on the scales that are left from FIG. 4A and FIG. 4B) should be attributed to the lower surface quality (i.e. the higher etch pit density) of GaP, which should be more vulnerable to the $AsH_3$ attack. However, to fairly compare this effect we must also consider the differences in the thermal decomposition of GaAs and GaP as well as the differences in the thermal decomposition of $AsH_3$ and $PH_3$. It is known, for example, that the As-vapor pressure over a GaAs surface is lower in comparison to the P-vapor pressure over GaP, which means that GaP decomposes faster or to a greater extent than GaAs. At the same time, the thermal decomposition of $PH_3$ and $AsH_3$ over a GaP substrate or, respectively, over a GaAs substrate in the temperature range of 400-600° C., (see left side of FIG. 5), are nearly equivalent, but still slightly in favor of the $AsH_3$ decomposition under 500° C. However, according to the right side of FIG. 5, the $AsH_3$ decomposition over a quartz surface (the surface of our reactor tube) within the pretreatment temperature range, i.e. above 350° C. but less than the growth temperature, is significantly stronger than the thermal decomposition of $PH_3$. This means that with increasing temperature, in one example, we provoke higher (in comparison to the case of GaAs) losses of P-atoms from the GaP surface. However, in another example, during the preheating stage, the decomposition of the $AsH_3$, which is flowing over the GaP surface inside the reactor tube, seems stronger than the thermal decomposition of $PH_3$—it is at least strong enough to provide plenty of As-atoms that can occupy the P-sites in the GaP crystal cell of the hot GaP substrate, which are liberated due to the GaP decomposition. Thus, by attacking the surface, $AsH_3$ leads to more severe pitting of the GaP surface (see FIG. 4B) than $PH_3$ on the GaAs surface (see FIG. 4A).

Figure 6B:
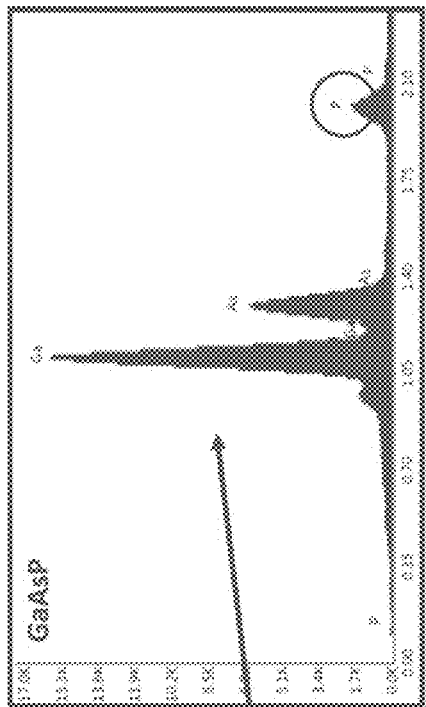
FIGS. 6B-6C present an EDS analysis that showing the presence of only GaAs in the pitted (dark) spots; in contrast the partly covered (white) areas indicate the presence of GaAsP.
Figure 6C:
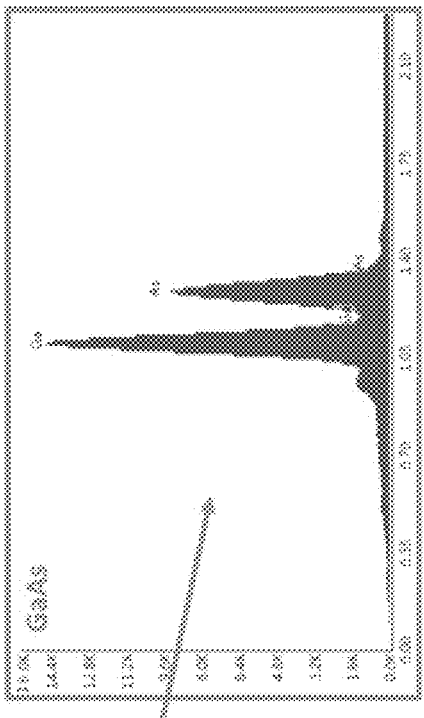
Figure 6A:
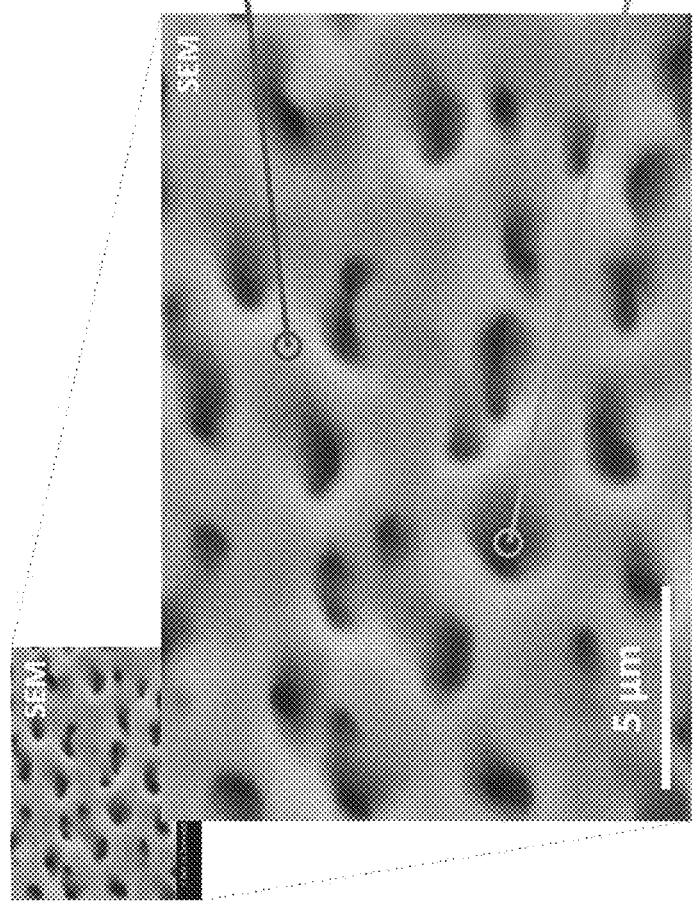
FIG. 6A presents an SEM image of a GaAs substrate preheated in PH$_3$:H$_2$ atmosphere.
Figures 7A, 7B:
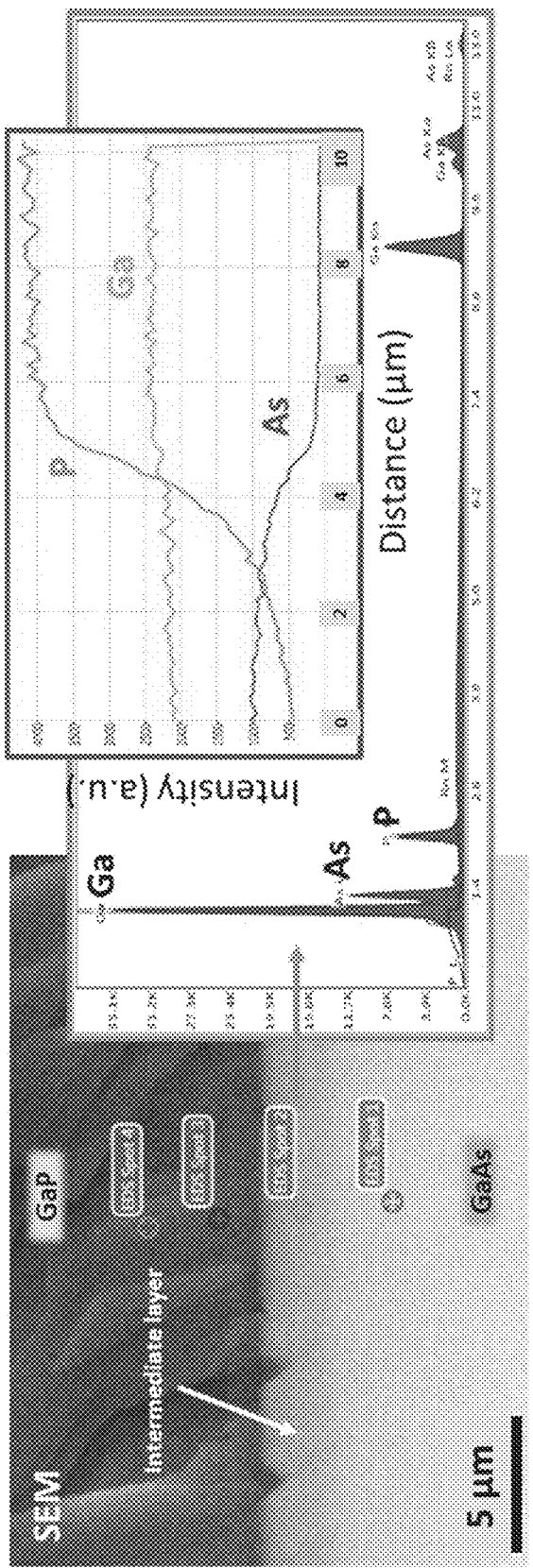
FIG. 7A presents a Nomarski cross section image that shows the formation of an intermediate layer between the GaAs substrate and the growing GaP layer.
FIG. 7B presents an EDS profile analysis that indicates that the forming buffer layer is a GaAsP ternary with a gradually changing composition.

It was discovered that roughening the surface is not the only result of exposing the semiconductor material to a non-native precursor during the preheating stage. Elemental analysis performed by Electron Dispersion Spectroscopy (EDS) of surfaces exposed to non-native precursors (see FIGS. 6A-6C) indicated that the exposing of GaAs to $PH_3$ or to the aforementioned $PH_3$-containing mixtures ($PH_3$:$H_2$ or $AsH_3$:$PH_3$:$H_2$) provokes the start of the formation of ternary $GaAs_xP_{1-x}$ islands still during the preheating stage prior to initiating the very heteroepitaxial growth of GaP/GaAs. These islands eventually coalesce forming a continuous intermediate transition $GaAs_xP_{1-x}$ buffer layer (FIG. 7A and FIG. 7B). By absorbing some of the mismatch strain, this transition buffer layer helps to accommodate the growing layer to the foreign substrate, realizing a smooth transition between the substrate to the growing material.

Figure 8:
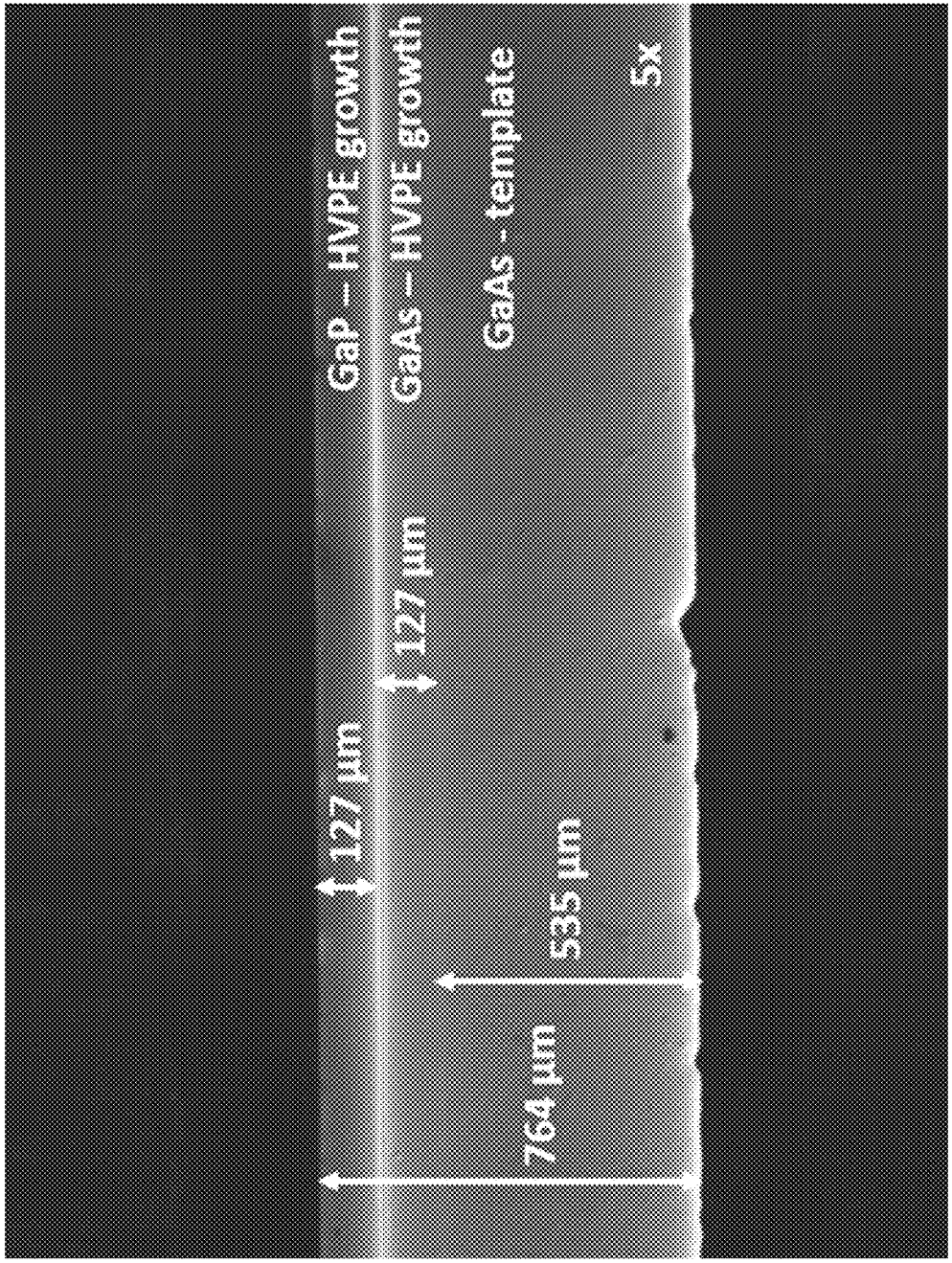
FIG. 8 presents a Nomarski cross section image of a grown multilayer heterostructure first of GaAs/GaAs and after that of GaP/GaAs.

The significance of the growth of non-native precursors on semiconductors is not a single isolated case but works with more materials (see FIG. 4A and FIG. 4B), and teaches us that we can grow multilayered heterostructures (see FIG. 8) in which two or more materials can by alternated multiple times in the same grown structure. For example, we can start growing GaP on a GaAs substrate pretreated in phosphine (or in a $PH_3$:$H_2$ mixture), and after that, pretreat the already grown HVPE GaP layer in arsine (or in an $AsH_3$:$H_2$ mixture) and grow GaAs, and after that to pretreat the already grown HVPE GaAs layer in, for example, hydrogen selenide ($H_2Se$) (or $H_2Se$:$H_2$) following by growth of ZnSe/GaAs. It is not difficult to imagine that such structures may have applications that will cross known boundaries. For example, the combination of several different semiconductor materials in a multi-material structure may be used for various device developments, including in the solar cell industry for portable high power solar cells or for multicolor detectors that simultaneously cover large areas of the spectrum, in particular the two atmospheric windows of transparency between 2-5 and 8-12 μm, or for development of phase or quasi-phase matching (QPM) structures for frequency conversion of laser sources operating in the poorly covered mid and longwave infrared. Finally, involving common substrates such as the unique electronic material Si may open the doors for numerous applications in optoelectronics.

The proposed approach is to some extent universal because it may be applied to different materials deposited one over another in a one-step epitaxial process, with or without the intentional assistance of an intermediate sublattice transition buffer layer (see FIG. 7) deposited between them. Such a layer, indeed, facilitates the growth of the following heterostructure. For example, one may need to control the quality of the buffer layer by carefully selecting when, i.e. at which temperature, to introduce the non-native substrate into the mixture. One may also gradually change the ratio of the non-native/native precursor gasses (i.e. the second precursors) in the mixture in order gradually to change the x composition of the starting material from a pure substrate material and ending up with a pure layer material. As one example, the growth of GaP on GaAs, the process may be started by maintaining the GaAs substrate initially in an $AsH_3$+$H_2$ mixture in order to protect its surface from thermal decomposition. Later, we may gradually start introducing $PH_3$, and increasing its amount in the mixture $AsH_3$:$PH_3$:$H_2$, while gradually reducing the amount of $AsH_3$ to zero. This process provides the conditions for growing the desired intermediate transition $GaAs_xP_{1-x}$ ternary in which the composition changes gradually to achieve a balanced growth of a pure GaP layer. The disclosed process allows precise control of both the composition and the thickness of the buffer layer that helps to achieve a smooth transition between the substrate and the growing material. In contrast with other well-known approaches, the proposed process for buffer layer deposition is an in-situ step from a continuous growth process: This naturally incorporates in one process all major techniques for engineering of buffer layers such as: (i) gradual change of the layer composition; (ii) growth on patterned templates which at larger lattice mismatches aims to allow a more uniform nucleation—in our case this is a growth on a random pattern of ternary islands; and (iii) using the buffer layer for efficient strain release, etc.

Because it is capable of controlling the thickness of the buffer layer, the invention allows one to extend the idea of the deposition of a ternary transition buffer layer to the growth of ternaries hundreds of microns thick. This can be achieved by maintaining a constant ratio in the mixture between the native and the non-native precursor that will ensure the desired composition (x) in the growing ternary during the entire growth process. As an example, the disclosed process has been used to grow $GaAs_xP_{1-x}$ ternary layers up to 300 μm thick on both GaAs and GaP substrates at the relatively high growth rate of about 100 μm/h. The ability to grow thick ternaries by the proposed process is important because, the tailoring of different compositions allows one to achieve the best combination of properties which are suitable for a particular application. For example, it was discovered that in the particular case of $GaAs_xP_{1-x}$ the following composition $GaAs_{0.34}P_{0.66}$ (x=0.34) provides lower two-photon absorption (2PA) than of GaAs but higher nonlinear susceptibility than of GaP in the wavelength of interest (1-1.7 μm)—these parameters are of great importance for applications such as QPM frequency conversion.

Thus such a combination of material properties satisfies requirements for using this new ternary material for frequency conversion devices. At the same time ternaries may be grown on either parenting material (in this case on GaAs or on GaP substrates) depending on how close to the given substrate is to their composition.

Such combinations of materials also, in general, represent stronger heteroepitaxial cases having smaller lattice and thermal mismatches with the related substrate.

The growth of ternaries is also an easier heteroepitaxial task because of the expected smaller lattice and thermal mismatches of the ternary (in this case $GaAs_xP_{1-x}$) with these two substrates (i.e. GaAs and GaP), compared to the lattice mismatch between the original substrate and growing materials (GaP and GaAs). Modification of material properties is another opportunity that the proposed invention provides. The aforementioned example demonstrates the usefulness of such modifications for the development of new laser sources. However, other materials will provide thick growths of other ternaries or quaternaries that may result in products that could support other research and development fields—optoelectronics, sensing (detectors), solar cells industry, etc.

This invention also allows one to use the pre-growth treatment approach for better polarity control during both the fabrication of orientation-patterned (OP) templates and the following thick HVPE growth on them. In contrast to the case where a regular substrate is exposed to a non-native precursor and the shape of the pits are irregular and randomly distributed, in the case of treating an OP template, the shape of the etch pits are rather longitudinal and oriented in two mutually perpendicular directions on the surface of domains with opposite crystallographic orientations (opposite polarity).

Figure 9C:
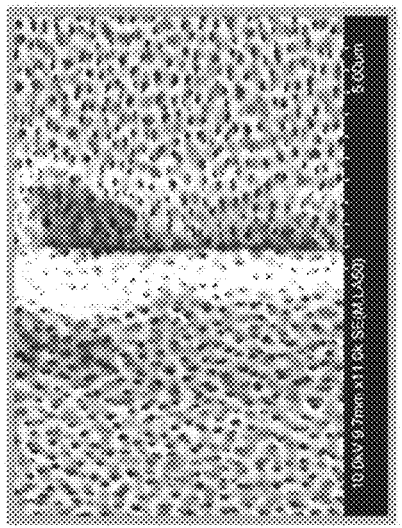
FIGS. 9A, 9B, 9C, 9D, and 9E_present SEM top surface images of an OPGaAs template showing the adjacent area around the boundary between two oppositely oriented domains.
Figure 9D:
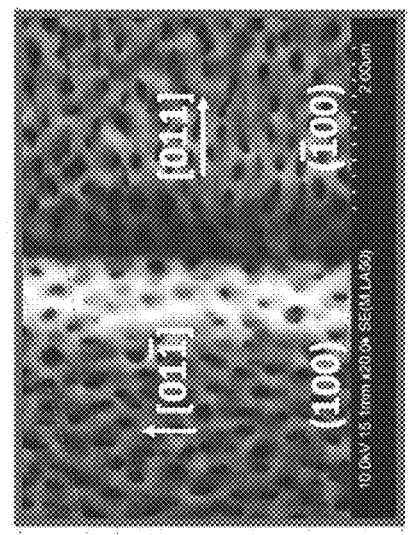
Figure 9A:
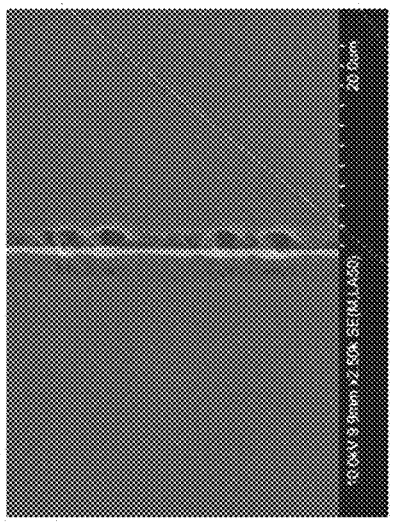
Figure 9B:
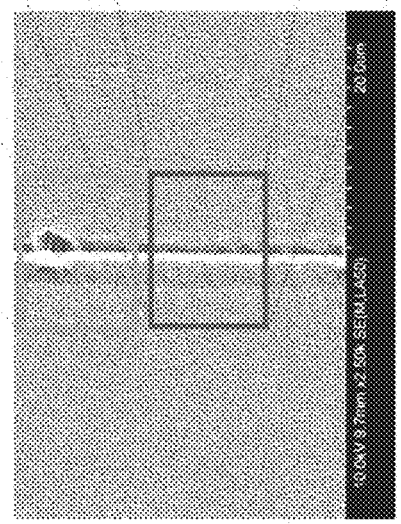
Figure 9E:
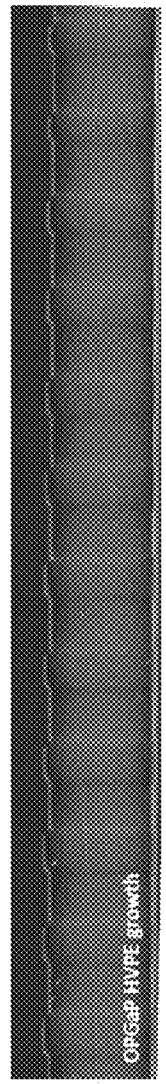

FIG. 9A and FIG. 9B, for example, present an area around the boundary between two oppositely-oriented domains, (100) and (1̄00), of an OPGaAs template before and after preheating the OPGaAs template in the presence of $PH_3$. FIG. 9C and FIG. 9D present the outlined small areas from FIG. 9B at higher magnifications. As one can see in FIG. 9C and FIG. 9D, after exposing the template to $PH_3$, the pits on the treated OPGaAs template are longitudinal and tend to be oriented in two mutually perpendicular directions, along [01 1̄] and along [011], on the (100) and (1̄00) oriented domains. This phenomenon, from a practical point of view, is an important feature of this invention, because it gives us a tool to easily determine the presence of the opposite domain orientations on the OP-template. Moreover, this approach is also an easy way to estimate the quality of the OP-template prior to growth, or the quality of the grown QPM structure, which is a simple in-situ non-destructive step. Until now it was possible to determine crystallographic orientations only with great uncertainty: (i) by the shape of specific surface features, which are more inherent to a particular orientation, or (ii) by etching, i.e. damaging the surface, after which the surface is not acceptable for subsequent growth. Heteroepitaxial growth, performed on such OPGaAs templates, resulted in thick (up to 300 μm) high quality OPGaP with rectangular domains having excellent fidelity (see FIG. 9E). Such types of templates may be used for QPM frequency conversion devices that could radiate, practically, in the entire spectrum, covering uncovered or poorly covered frequency ranges. Based on III-Nitrides, for example, such devices can radiate partly in the UV and partly in the close to the UV visible spectrum, making them useful for water purification, LEDs, energy conservation, high power lasers for high energy physics, etc. Frequency conversion devices based on wideband compound semiconductors such as GaAs, GaP, ZnSe, or ZnTe, radiating in the mid- and long-wave IR (especially if they cover both atmospheric windows of transparency) may be useful in IR countermeasures for protection of military aircraft and ships from heat seeking or laser guided missiles. Respectively, FC sources radiating in the microwave and/or THz regions may be useful in airport scanners, remote sensing of chemicals (explosives) or biological agents, in industry, medicine (biopsy-free cancer cell detection), and science (THz spectroscopy).

Depending on which mode of heteroepitaxy is stimulated during growth, e.g. Volmer-Weber (island growth), Frank-van der Merwe (layer-by-layer growth) or Stranski-Krastanov (layer-plus-island growth), and what type of strain relief is present, i.e. elastic (surface roughening) or plastic (dislocation formation), the proposed process may be used for generating quantum wells or quantum dots, or other nano- and micro-structures. By skillful use of these growth modes this process may combine similar or different materials, for example electronic materials, such as Si with optoelectronic materials, e.g. GaAs, GaP, ZnSe, ZnTe, etc., or even their ternaries or quaternaries. Thus the described approach contributes to advances in the development of optoelectronic devices as well.

The disclosed process allows for one-step thick growth without the need for a preliminary deposition (usually using a thin growth technique) of another material with a smaller lattice mismatch with the substrate. For example, as it is known in the prior art, thick HVPE GaN layers can be grown on SiC substrates only after the deposition of a thin AlN layer by MBE or MOCVD. Similarly, thick HVPE GaN may be grown on thin GaN or AlN deposited in advance on sapphire, again by MOCVD or MBE. The MBE and MOCVD from one side and the HVPE from another are growth processes which are quite different by their natures, as the first two (MOCVD and MBE) are far-from-equilibrium processes and can be used only for up to 1-2 μm thin growth, while the third one (HVPE) is a close-to-equilibrium process that can be used for thick growth. This means that the old approach, using MOCVD or MBE, is a two-step growth process, which needs more high-tech instruments, i.e. more investments. These limitations are not necessary with the disclosed approach.

The disclosed process also eliminates the need to first grow (typically by HVPE) an intentionally-deposited low temperature (LT) buffer layer on the substrate prior to the growth of the high temperature (HT) layer. This is known the prior art for the thick HVPE growth of GaN, for example. The deposition of an intermediate layer aims to reduce the strain between the sapphire substrate and the growing GaN layer. A LT buffer layer does this job but, at the same time, it is a layer with extremely low crystalline quality and, thus, it is a source of a great number of dislocations, i.e. the LT buffer layer does not provide always an optimal foundation to start the growth of the actual GaN layer. The proposed approach allows the formation of an intermediate transition layer naturally, in-situ, and during the initial preheating of the substrate and not through a growth process—this occurs prior to the start of growing the actual layer but also may continue during the initial stages of growth as well. According to the present invention, it is not necessary for the buffer layer to be a LT layer. Instead, the choice of the temperature of the buffer layer formation may be controlled, and thus its quality may be controlled.

We would like once again to emphasize another significant difference between the proposed buffer layer growth and the prior art by using the same example: an HVPE-grown LT GaN buffer layer. In the prior art case one can choose to change the V-III ratio during the buffer layer deposition in order for this layer to accommodate the substrate and growing layer. However, the buffer layer and the subsequent layer are from still from one and the same material, GaN. Thus there is still homoepitaxy at the boundary between LT GaN buffer layer and HT growing GaN layer. In contrast, the inventive method disclosed herein is a heteroepitaxial case, and we may selectively change the composition of the growing material for a gradual replacement of the substrate material with the growing layer.

Thus the optimized growth approach presented herein avoids or solves many of the current problems and shortcomings of heteroepitaxy. The optimized growth approach presented herein demonstrates several advantages over the known and comfortable homoepitaxy processes. The disclosed process clearly indicates that there are particular cases when heteroepitaxy is preferable even when homoepitaxy is possible.

Heteroepitaxy provides economic and quality advantages: for example, the available GaP (for 2-inch wafers) on the market is 5-6 times more expensive than the corresponding GaAs, the GaP having much lower quality with respect to the etch pit density (EPD) and wafer parallelism. This means that the quality of OPGaP templates prepared from such wafers will be also low, because we should expect poor quality of the HVPE growth on them. Accordingly, the performance of frequency conversion devices based on such templates will also be unacceptable. The ability to use GaAs substrates and OPGaAs templates for growth of GaP and OPGaAs solves this problem.

In addition, heteroepitaxy enables the use of techniques suitable for thick epitaxial growth, e.g. HVPE, and the corresponding particular technological applications that require thick epitaxial growths. At this moment, due to the complex growth mechanisms of heteroepitaxy, knowledge of such mechanisms is relatively limited despite the great deal of effort made over the last couple of decades. For example, on an atomic scale it is known how the growth proceeds only for the first few monoatomic layers, even for the homoepitaxial growth of plain semiconductors, e.g. Si and Ge. That is why the semiconductor industry has adopted primarily thin growth techniques such as MOCVD and MBE, and only for a limited number of well-studied materials.

Heteroepitaxy allows for the optimization of the most promising candidate for thick epitaxial growth, the HVPE technique. Other techniques for thicker epitaxial growth used today are either too slow, resulting in impractically small crystals (solvothermal growth, etc.), or thin layers (liquid phase epitaxy, etc.) or the nature of the growth technique is such that it does not allow precise control of the process parameters during growth. An example of such a process is physical vapor deposition (PVD) which is known mostly as a bulk growth technique (including for growth of ZnSe), although it was once used in heteroepitaxy of ZnSe/GaAs. However, the bulk growth was incapable of providing large enough single grain crystalline substrates, while the layer growth led to rather low material quality and limited optical results. However, even though the HVPE approach provides more options for control of the growth process and more choices for growth chemistry, HVPE also has its own problems. Such as, for example, the severe competitive parasitic nucleation on the inner quartz surfaces of the reactor that accompanies the deposition: such parasitic nucleation only slows down the process, depletes the precursor sources, and deteriorates layer quality.

The disclosed process allows successful heteroepitaxial growth even at relatively large lattice and thermal mismatches, and without patterning the substrate, which in many cases is the standard procedure. The present invention is based on the accumulation of a significant amount of information about a great number of semiconductor materials and various growth processes used to grow them. This allowed us to realize the significance of the determination of important characteristics of heteroepitaxy, e.g. the thickness of the pseudomorphous growth, the periodicity of the misfit dislocations, or the mechanisms of strain relief, to make the related efforts in several particular cases. In turn, the determination of these parameters allowed us to develop criteria by which to predict other successful cases of heteroepitaxy, and thus to realize heteroepitaxial growth at mismatches that at first sight looked impossible.

The disclosed invention is based on our understanding of the complex chemistry and growth mechanisms of heteroepitaxy of wideband semiconductor materials. The invention secures a smooth transition between two materials, for example GaAs and GaP, not through a forced-growth process but during the preheating of the substrate and during the initial stages of growth. During the initial growth stages, the process directs the gradual replacement of substrate atoms, for example V-group atoms, with V-group atoms from the growing material. For example, the process may direct the replacement of As atoms in the crystal cell of a GaAs substrate with P atoms during the preheating process, which may be conducted in a phosphine ($PH_3$) atmosphere or a mixture of phosphine ($PH_3$) and arsine ($AsH_3$). The process requires the user to decide at which temperature (if still in the preheating stage) to initiate such replacement, and whether this temperature should be kept constant during the deposition of this buffer layer, or whether it should be increased at some rate until achieving the growth temperature. The user also must decide whether to keep the arsine/phosphine ratio constant or to gradually change this ratio from arsine only to phosphine only in order to achieve the smoothest transition between substrate material (e.g. GaAs) and grown layer material (e.g. GaP).

From another point of view the disclosed approach is universal also because it may be applied to a wide range of different materials having wide ranges of differences in their lattice constants and their thermal expansion coefficients (resp. different thermal conductivities) deposited one over another in a one-step epitaxial growth process, with or without the intentional deposition of the aforementioned intermediate sub-lattice transition buffer layer between them. This approach is demonstrated to be successfully applied not only for growth of GaP on GaAs but also for the opposite growth of GaAs on GaP. These cases, from the perspective of lattice mismatches, are not highly favorable (see FIG. 1). Accordingly, that is why the disclosed method may be applied to other related materials systems, some of which may have lattice mismatches less unfavorable than GaP/GaAs. Such are, for example, ZnSe/GaAs or GaP/Si, or ZnTe/GaSb, etc. (see FIG. 1 and Table 2).

Regarding the particular case of the growth of ZnSe on GaAs, the GaAs substrate (or template) is preheated in hydrogen selenide ($H_2Se$) mixed with $H_2$, or in a $H_2Se$:$AsH_3$:$H_2$ mixture in order to partially and gradually replace the V-group atom (As) in the GaAs crystal cell with Se and thus form a $GaAs_xSe_{1-x}$ ternary buffer layer. After this step, the growth may continue with the introduction of the Zn-precursor, which may be either metallic Zn overflowed by HCl (or an HCl+$H_2$ mixture) to form zinc chloride ($ZnCl_2$), or simply $ZnCl_2$ overflowed by $H_2$, or even a Zn-rich $ZnCl_2$ solution overflowed by HCl+$H_2$ mixture. This may be the better choice due to the relatively high vapor pressure of zinc. Table 2 compares the realized GaP/GaAs heteroepitaxy with some other examples (incl. ZnSe/GaAs) for prospective heteroepitaxial cases (more examples are provided in FIG. 13).

TABLE 2

Some favorable cases of
heteroepitaxy based on lattice mismatch.

| Heteroepitaxy | Lattice mismatch [%] |
|---|---|
| GaP on GaAs | −3.57 |
| ZnSe on GaAs | +0.24 |
| ZnTe on GaSb | +0.08 |
| ZnTe on InAs | +0.70 |
| AlAs/GaAs | +0.13 |
| GaP/Si | +0.37 |

From Table 2 one can easily see that all other examples provided are more favorable than GaP/GaAs, providing much smaller (less than 1%) lattice mismatches. Of course, to make the "right" choice one should take into account what the desired application might be and some other related properties of the particular material candidate. For example, a brief comparison of ZnSe and ZnTe shows that ZnTe has about the same transmission range as ZnSe but lower 2PA and 3 times higher nonlinear susceptibility at the desired pumping wavelength of about 1 μm, i.e. ZnTe may be a better choice for nonlinear frequency conversion devices. Of course, one also should pay attention to the specific technological limitations related to the growth of a particular material, e.g. GaP may not be grown by HVPE directly on Si, but it may be grown at high quality by MOCVD or MBE. Nevertheless, the proposed technique may give better options for many other materials, including some that have never been grown epitaxially, or even by any other techniques, in a monocrystalline shape, and in a size large enough for practical use, e.g. ZnSe or ZnTe.

With regard to the GaP/Si combination (the last line in Table 2), which is a growth of a compound semiconductor (GaP) on a plain semiconductor (Si), our approach may be slightly different due to the extremely strong Si—Si bond. In this case, it may be preferred to preheat the Si substrate in $H_2$ only to provoke some thermal decomposition (as shown in FIG. 3B) to allow some Si-atoms to escape the substrate and thus to give a chance for the approaching P-atoms to occupy their positions. In the alternative, one may attempt to do this by etching the Si-substrate with a known Si etchant. The opposite is also possible: the growth of Si on GaP, which is another case in which a solution for an etchant material may be required. For example, we may use silane ($SiH_4$) to "attack" the GaP substrate before we start growing Si on it.

These new suggested heteroepitaxial cases (Table 2 and FIG. 13) can be leveraged by their inclusion in related ternary or even quaternary materials that not only combine the best properties of two (or more) semiconductor materials (of course, in relation to the desired particular practical applications), but that also facilitate the heteroepitaxial growth disclosed herein, that, in general, the ternary shall have a closer lattice match to the parenting substrate materials. Another direction that may be taken in developing this idea is to make the lattice constants between substrate and growing layer closer by doping the growing layer, while keeping in mind that doping with dopants that are different in size (i.e. smaller or larger ionic radius) will significantly change the lattice constant of the doped material. On the other hand, the dopant concentration may be gradually changed during growth, which will form a transition layer with a gradually-changing lattice constant. This will secure an even smoother transition between the substrate and the growing layer. Each of these variations of the proposed in-situ substrate pretreatment may be followed by a growth stage aimed to build thin or thick layers.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Experimental

As illustrated in FIGS. 10A-10J, the related experiments were conducted in a hot wall 3-inch diameter horizontal quartz reactor 10 positioned in a three-zone resistive furnace 12. The furnace 12 is not depicted in FIGS. 10B-10J for clarity. If no ternaries are to be formed, the gasses labelled as "ternary-forming gas" in FIGS. 10A-10J correspond to the "second precursor gas" of the claims. Mixtures of the second precursor gasses, in constant ratios or ratios varying over time, may be used to support the growth of ternaries, which may in turn support the growth of the desired growing layer. The sole "precursor gas" of FIGS. 10A-10J corresponds to the "first precursor gas" of the claims. The first precursor gas is usually hydrogen chloride (HCl) diluted to the desired extent by the carrier gas (usually $H_2$). The role of the first precursor gas is to pick-up a II or III-group element (Ga, Al, Sb, Cd) from an open boat or a bubbler, and with it to form a metal-chlorine compound which is delivered to the mixing zone, making it available to participate in the growing process The second precursor, or ternary-forming gas, is usually a hydride of a V or VI group element ($AsH_3$, $PH_3$, $H_2S$, $SbH_3$, etc.) diluted to the desired extent by the carrier gas (usually $H_2$). The role of the second precursor (ternary-forming gas), which is actually the precursor of the V or VI-group element, is delivered to the mixing zone, making it available to participate in the growing process. We call the second precursor "ternary-forming" because the reactions between the first precursor gas and the ternary-forming gas on the foreign substrate may result in the formation of ternary islands on the substrate, which may eventually coalescence to form a continuous ternary buffer layer.

Example 1—Growth of GaP on GaAs Substrate

These embodiments of the invention are based on hydride vapor phase epitaxy (HVPE) and the heteroepitaxial growth of GaP on GaAs substrates, or the opposite case of the heteroepitaxial growth of GaAs on GaP substrates. However, one should bear in mind that these are two successfully-realized examples, but not the most favorable examples in terms of their lattice constants or in their thermal expansion coefficients or thermal conductivities. As explained in the text above, many other semiconductor materials may be grown by this technique and are favored by the proposed approach. GaAs substrates and orientation-patterned GaAs templates (OPGaAs) are available at high quality and at a reasonable price. The lattice mismatch is larger but negative, which means that the GaP layer grows under tensile stress which is the more favorable case because this arrangement compensates the naturally-compressed surface of the GaAs substrate.

With regard to FIG. 10A, a quartz boat 14 positioned in the first zone 16 and filled with molten gallium (Ga) was placed in a one-inch diameter inner tube 18 and a mixture of hydrogen $H_2$ as carrier gas and HCl as a first precursor gas was flowed over the boat 14. The purpose of the $H_2$ carrier gas is not only to carry the HCl precursor gas but also to dilute the HCl flow to a desired extent while the HCl flow picks up some gallium (Ga) from the boat 14 to form gallium chloride (GaCl$_3$) in the reaction:

$$6HCl+2Ga \rightarrow 2GaCl_3+3H_2 \quad \text{(eq. 3)}$$

Another peripheral flow, a mixture between hydrogen and phosphine (PH$_3$), as a second precursor gas, in the case of GaP growth, or arsine (AsH$_3$) in the case of GaAs growth, or their mixture, including H$_2$ as a carrier gas and a diluter, in the case of GaAs$_x$P$_{1-x}$ growth, is introduced in the reactor 10 to mix with the GaCl$_3$ in the second reactor zone 20, called "mixing zone", with the intention of reacting the mixture on the surface of the substrate 22 to form, respectively, GaP, GaAs, or a GaAs$_x$P$_{1-x}$ ternary. With regard to FIG. 10B, the process is similar to that presented with regard to FIG. 10A, except that AsH$_3$ is the ternary-forming gas instead of PH$_3$, and a layer of GaAs is formed on a GaP substrate. GaP substrates and OPGaP templates are available, but have lower quality and a much higher price than the GaAs substrates shown in FIG. 10A. The lattice mismatch of FIG. 10B is large (the same as in FIG. 10A but positive) which means that the GaAs layer grows under compressive stress, which is less favorable than the case of tensile stress. After forming GaCl$_3$, the most probable chemical reactions related to forming GaP on GaAs or GaAs on GaP are:

$$GaCl_3+PH_3 \rightarrow GaP+3HCl \quad \text{(eq. 4a)}$$

$$GaCl_3+AsH_3 \rightarrow GaAs+3HCl \quad \text{(eq. 4b)}$$

Other heteroepitaxial cases will have distinct but similar chemistry.

Some typical values for the inner and outer flows of H$_2$, HCl, PH$_3$, and AsH$_3$ related to the HVPE growth of GaP, GaAs, or GaAs$_x$P$_{1-x}$ are provided in Table 3 below, as an example. However, these numbers are strictly correlated to growths of GaAs, GaP, or their ternaries and to the particular configuration of the HVPE reactor presented in FIG. 10A, e.g. a 3-inch diameter reactor tube horizontal quartz reactor. In these particular cases the total gas flow was less than 400 sccm (i.e. standard cubic centimeters per minute: the "standard" indicates a gas flow at standard conditions, i.e. at atmospheric pressure and room temperature). However, other reactor configurations or processes that involve other materials and precursors may need different flows and flow regimes. In all cases, however, the total gas flow in the close-to-equilibrium HVPE process will be much less than the huge (many liters) flows of gases typically used in the far-from-equilibrium processes, such as MOCVD or MBE, where the high supersaturation is a strict requirement.

TABLE 3

Some typical values for the inner and outer flows (sccm) of H$_2$, HCl, PH$_3$, and AsH$_3$ during growths of GaP, GaAs, or their ternaries.

| Inner Flow | | Outer Flow | | | |
|---|---|---|---|---|---|
| H$_2$ | HCl | H$_2$ | HCl | AsH$_3$ | PH$_3$ |
| 65-75 | 30-35 | 100-110 | 30-35 | 70-80 | 50-60 |

With respect to the rest of the growth parameters, all experiments were conducted with parameters within the following ranges: pressure <10 Torr, substrate temperatures 720-740° C. for the growth of GaP (respectively 680-700° C. for the growth of GaAs), and V/III ratios in the range of 2-3. These ranges provided conditions for a close-to-equilibrium process at relatively low supersaturation (typically between 0.5-1.0), which is the nature of the HVPE growth.

Growth experiments were conducted homoepitaxially (GaP/GaP and GaAs/GaAs) and heteroepitaxially (GaP/GaAs and GaAs/GaP) on plain "on-axis" (100) GaAs and GaP substrates and on the same (100) substrates but mis-oriented with 4° towards (111)B. Growths of the GaAs$_x$P$_{1-x}$ ternary at different x ratios were also performed on both GaP and GaAs substrates.

An important step in this process, strongly correlated to this invention, is related to the way of protecting the substrate 22 (FIGS. 10A-10J) from thermal decomposition before growth begins. Such protection is generally limited to protecting the substrate from thermal decomposition as in FIG. 3B, but not necessarily from other, desired, influences of the non-native precursors as presented in FIGS. 3C, 3D, 4A-4D, 6A, and 9B-9D). For this purpose when the reactor temperature reaches about 350° C. the substrate must be kept in either an AsH$_3$ atmosphere, in the case of a GaAs substrate, or in a PH$_3$ atmosphere, in the case of a GaP substrate. In the case of heteroepitaxy, we have more options, each of which need to be effective. These include the protection of a GaAs substrate in a PH$_3$ atmosphere or, vice versa, protection of a GaP substrate in an AsH$_3$ atmosphere. In the alternative, we may also protect the wafer by maintaining a mixture of PH$_3$ and AsH$_3$ gases. In all these cases we should keep in mind that, typically, the precursor flows, as well as the hydride precursors, e.g. PH$_3$, AsH$_3$, H$_2$Se, H$_2$Te, SbH$_3$, etc., are diluted by the carrier gas (H$_2$); as a practical matter, we use mixtures of AsH$_3$:H$_2$, or PH$_3$:H$_2$, or AsH$_3$:PH$_3$:H$_2$. One should also bear in mind that the growth of other materials (see FIGS. 10C-10J) will require distinct chemistries for substrate-pretreatment and growth. For example, the growth of ZnSe on GaAs substrates requires pretreatment of the GaAs substrate in an H$_2$Se:H$_2$ or an AsH$_3$:H$_2$Se:H$_2$ precursor mixture. To fully explore the capabilities of the pre-growth stage, we conducted the preheating procedures not only in different precursor atmospheres or mixtures of precursors, but also using different flow rates, different precursor ratios in the mixtures and different regimes of introducing those gases following the determined schemes. Further experiments of this nature were continued as the preheating stage was followed by the stage of the epitaxial growth. The later experiments were performed in order to assess the impact of the initial stages of growth on the final layer quality.

Example 2—Growth of ZnSe on GaAs Substrate

Figure 10C:
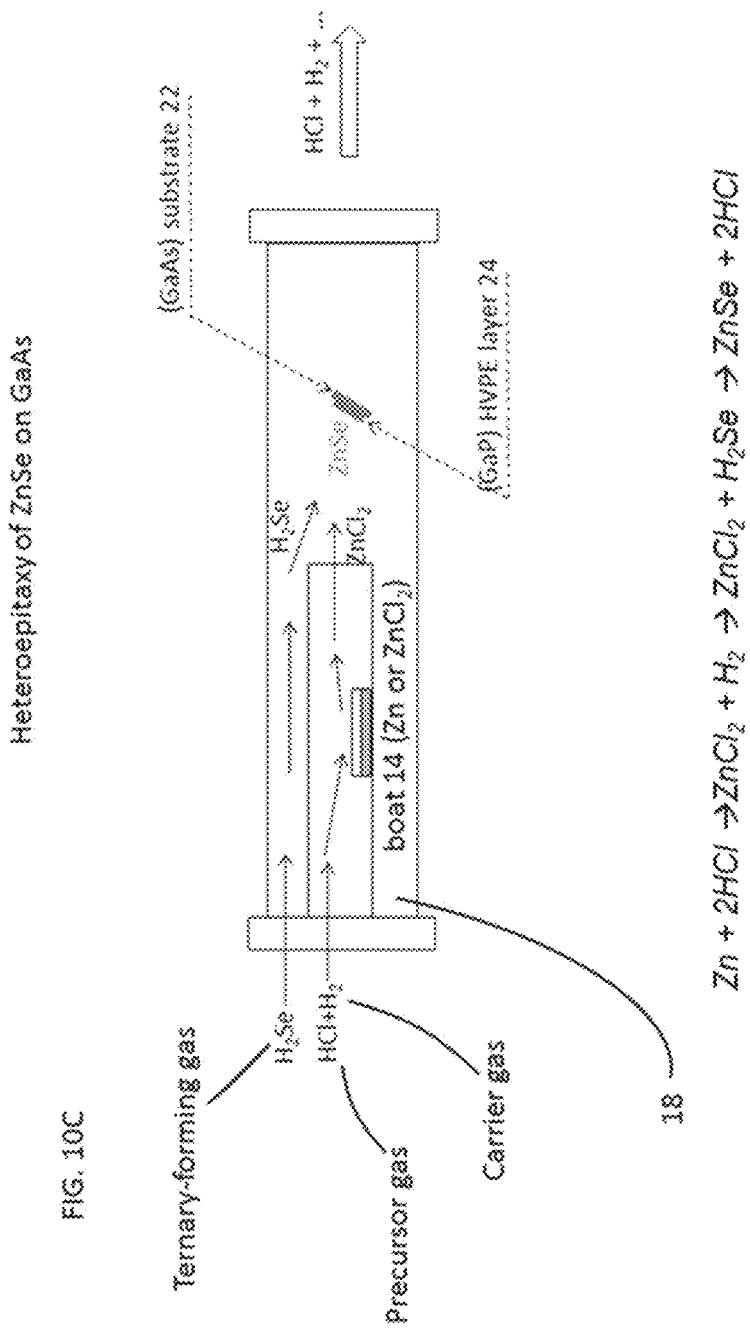
FIG. 10C illustrates a schematic drawing of an HVPE apparatus for optimized thick heteroepitaxial growth of ZnSe with in-situ pre-growth treatment of the GaAs substrate or the template, according to an embodiment of the invention.

This embodiment of the invention is based on hydride vapor phase epitaxy (HVPE) and the heteroepitaxial growth of ZnSe on GaAs substrates, or the opposite case of the heteroepitaxial growth of GaAs on ZnSe substrates. As it was already explained in the text above, many other semiconductor materials may be grown by this technique and are favored by the proposed approach. As illustrated in FIG. 10C, the related experiments corresponding to FIGS. 10A-10J were conducted in a hot wall 3-inch diameter horizontal quartz reactor 10 positioned in a three-zone resistive furnace 12. The furnace 12 is not depicted in FIGS. 10B-10J to enhance clarity. A quartz boat 14 positioned in the first zone 16 and filled with molten zinc, or zinc chloride (ZnCl$_2$), or a Zn-rich solution of ZnCl$_2$, was placed in a one-inch diameter inner tube 18 and a mixture of hydrogen H$_2$ and HCl (first precursor) was flowed over the boat 14. As explained above, the purpose of the H$_2$ is not only to carry the HCl but also to dilute the HCl flow to a desired extent while the HCl flow picks up some zinc (Zn) from the boat 14 to form zinc chloride (ZnCl$_2$). Another peripheral growth, a mixture between hydrogen and hydrogen selenide ($H_2Se$) is introduced (as a second precursor) in the reactor 10 to mix with the $ZnCl_2$ in the second reactor zone 20, the "mixing zone", with the intent to react the mixture on the surface of the substrate 22 to form ZnSe. With regard to FIG. 10C, the process is similar to that presented with regard to FIG. 10A, except that $H_2Se$ is the ternary-forming gas, and a layer of ZnSe is formed on a GaAs substrate. It is noted that ZnSe crystalline substrates large enough (i.e. 1-2 inch in diameter) to create a useful product or OPZnSe templates are not commercially available; even the best available samples on the market, which are typically no larger than 5 mm×5 mm contain at least several domains with different orientations.

ZnSe and GaAs yield a very small lattice mismatch (+0.238%). This provides opportunities to grow crystalline ZnSe on non-native GaAs substrates. High quality GaAs substrates and orientation-patterned GaAs templates (OP-GaAs) are commercially available at a reasonable price.

Gas flow parameters for the growth of ZnSe on GaAs are similar to those presented in example 1. As depicted in FIG. 10C, the formation of ZnSe on GaAs (described below) is likely according to the reaction:

$Zn+2HCl \rightarrow ZnCl_2+H_2$ (eq. 5a)

$ZnCl_2+H_2Se \rightarrow ZnSe+2HCl$ (eq. 5b)

The same chemistry may be used for growth of CdSe on InAs because their lattice mismatch still acceptably small (−0.139%) (see FIG. 13), taking into account that 2-inch, good quality InAs is commercially available at a reasonable price.

Example 3—Growth of ZnTe on GaSb Substrate

This embodiment (see FIG. 10D) of the invention is based on hydride vapor phase epitaxy (HVPE) and the heteroepitaxial growth of ZnTe on GaSb substrates, or the opposite case of the heteroepitaxial growth of GaSb on ZnTe substrates. As illustrated in FIG. 10D, the related experiments were conducted in a hot wall 3-inch diameter horizontal quartz reactor 10 positioned in a three-zone resistive furnace 12. The furnace 12 is not depicted in FIGS. 10B-10H to enhance clarity. A quartz boat 14 positioned in the first zone 16 and filled with molten zinc (Zn) and zinc chloride ($ZnCl_2$) is placed in the one-inch diameter inner tube 18, and a mixture of hydrogen $H_2$ as carrier gas and HCl (first precursor) is flowed over it. The purpose of the $H_2$ is not only to carry the HCl but also to dilute the HCl flow to a desired extent while the HCl flow picks up some zinc (Zn) from the boat 14 to form zinc chloride ($ZnCl_2$). Another peripheral growth, a mixture between hydrogen and hydrogen telluride ($H_2Te$) (second precursor) in the case of ZnTe growth is introduced in the reactor 10 to mix with the $ZnCl_2$ in the second reactor zone 20, the "mixing zone", in order to react the mixture on the surface of the substrate 22 to form ZnTe. With regard to FIG. 10D, the process is similar to that presented with regard to FIG. 10A, except that $H_2Te$ is the ternary-forming gas, and a layer of ZnTe is formed on a GaSb substrate. It is noted that ZnTe crystalline substrates large enough (i.e. 1-2 inch in diameter) to create a useful product or OPZnTe templates are not commercially available. Even the best commercially-available samples available are typically no larger than 5 mm×5 mm, and contain at least several domains with different orientations.

ZnTe and GaAs yield a very small lattice mismatch (+0.083%). This provides opportunities to grow crystalline ZnTe on non-native GaSb substrates. However, while 2-inch, good quality GaSb substrates are commercially available at a reasonable price, orientation-patterned GaSb templates (OPGaSb) are not yet available.

Gas flow parameters for the growth of ZnTe are similar to those presented in example 1. As depicted in FIG. 10D, the formation of ZnTe on GaSb is likely according to the reaction:

$ZnCl_2+H_2Te \rightarrow ZnTe+2HCl$ (eq. 6a)

if the process is started with $ZnCl_2$. However, if the process is started with Zn and HCl to form $ZnCl_2$ the most probable chemical reactions will be:

$Zn+2HCl \rightarrow ZnCl_2+H_2 \rightarrow ZnCl_2+H_2Te \rightarrow ZnTe+2HCl$ (eq. 6b)

Regarding the opposite case of the heteroepitaxial growth of GaSb on ZnTe substrates (see FIG. 10E), the most probably chemical reactions will be:

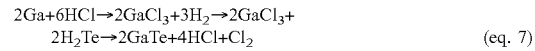

$2Ga+6HCl \rightarrow 2GaCl_3+3H_2 \rightarrow 2GaCl_3+$
$2H_2Te \rightarrow 2GaTe+4HCl+Cl_2$ (eq. 7)

However, it is less probable for one to choose such growth, because as explained above good quality ZnTe substrates (or OPZnTe templates) are unavailable in sizes large enough for practical use.

The same chemistry may be used for the growth of GaTe on InAs or CdTe on InSb as far as their lattice mismatches (−0.100% and +0.040%, respectively) are still acceptably small (see FIG. 13), taking into account the availability of the related substrates or templates.

Example 4—Growth of β-GaSe on GaN or AlN Substrate

This embodiment of the invention is based on hydride vapor phase epitaxy (HVPE) and the heteroepitaxial growth of β-GaSe on GaN or AlN substrates, or the opposite case of the heteroepitaxial growth of GaN or AlN on β-GaSe substrates. This embodiment is also based on HVPE heteroepitaxial growth of α-GaSe on GaP substrates, or the opposite case of growth of GaP on α-GaSe substrates, taking into account that good quality 2-inch GaN and GaP substrates, as well as OPGaN and OPGaP templates, are commercially available (with some limited options) while only relatively expensive small sized (10 mm×10 mm) GaSe samples are available with some limited options.

Figure 10F:
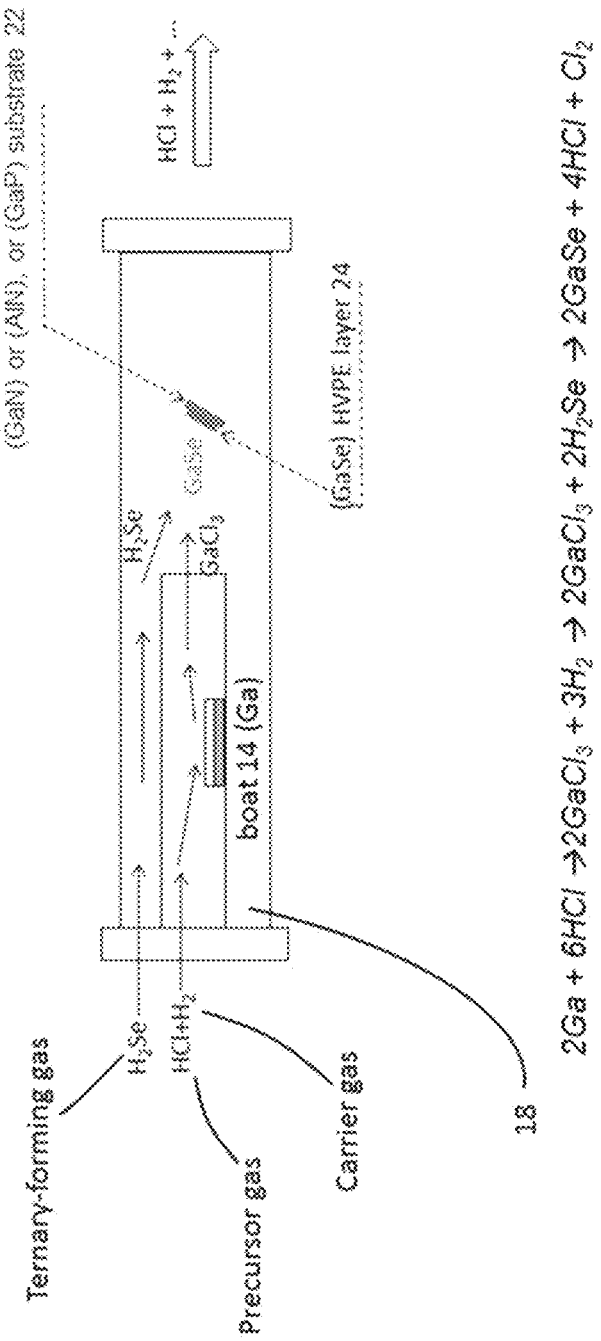
FIG. 10F illustrates a schematic drawing of an HVPE apparatus for optimized thick heteroepitaxial growth of hexagonal β-GaSe with in-situ pre-growth treatment of the GaN (or AlN) substrate or the template, or zinc blended α-GaSe with in-situ pre-growth treatment of the GaP substrate or the template, according to an embodiment of the invention.

As illustrated in FIG. 10F, the related experiments were conducted in a hot wall 3-inch diameter horizontal quartz reactor 10 positioned in a three-zone resistive furnace 12. A quartz boat 14 positioned in the first zone 16 and filled with molten gallium (Ga) was placed in a one-inch diameter inner tube 18 overflowed with a mixture of hydrogen $H_2$ as carrier gas and HCl (first precursor). The purpose of the $H_2$ is not only to carry the HCl but also to dilute the HCl flow to a desired extent while the HCl flow picks up some gallium (Ga) from the boat 14 to form gallium chloride ($GaCl_3$). Another peripheral growth, a mixture between hydrogen and hydrogen selenide ($H_2Se$) (second precursor) in the case of GaSe growth is introduced in the reactor 10 to mix with the $GaCl_3$ in the second reactor zone 20, the "mixing zone", in order to react the mixture on the surface of the substrate 22 to form GaSe. The most probable chemical reactions related to forming GaSe is:

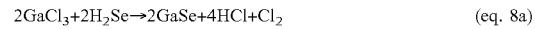

$2GaCl_3+2H_2Se \rightarrow 2GaSe+4HCl+Cl_2$ (eq. 8a)

if the process is started with GaCl$_3$. However, if the process is started with Ga and HCl to form GaCl$_3$, the most probable chemical reactions will be:

$$2Ga+6HCl \rightarrow 2GaCl_3+3H_2 \rightarrow 2GaCl_3+ \\ 2H_2Se \rightarrow 2GaSe+4HCl+Cl_2 \qquad \text{(eq. 8b)}$$

As described above, this variation is related to the growth of the hexagonal β-phase of GaSe on hexagonal substrates (GaN or AlN) or the zinc blended α-phase GaSe (α-GaSe) on GaP substrates. The latter case, however, is much more favorable due to the small lattice mismatch of (α-GaSe) with commercially-available zinc-blended GaP (−0.607%). For comparison, the lattice mismatch of β-GaSe with the III-Nitrides (GaN and AlN) is about +17% (see FIG. 10F and FIG. 13). As one can see from the above examples, two different phases of the same material (i.e. α-GaSe and β-GaSe) may be grown on two or more different substrate materials (AlN, GaN, GaP). This is another alternative variation of the proposed growth approach. Hexagonal substrates are from materials that possess hexagonal symmetry, i.e. having crystal cells that are hexagons. Wurtzite crystals have hexagonal symmetry.

The grown GaSe in this case should be with hexagonal symmetry (for example β-Ga$_2$Se$_3$)—the same as the symmetry of the substrates (GaN or AlN). However, the same chemistry can be used for growth of α-Ga$_2$Se$_3$ with zinc blended symmetry if the GaN or the AlN substrate is replaced by a substrate with cubic symmetry and small lattice mismatch with α-Ga$_2$Se$_3$, for example with a GaP substrate (lattice mismatch −0.607%). The opposite heteroepitaxial cases, for example growth of GaN on the hexagonal β-Ga$_2$Se$_3$ (FIG. 10G) or growth of GaP on the zinc blended α-Ga$_2$Se$_3$ is also possible.

Figure 10G:
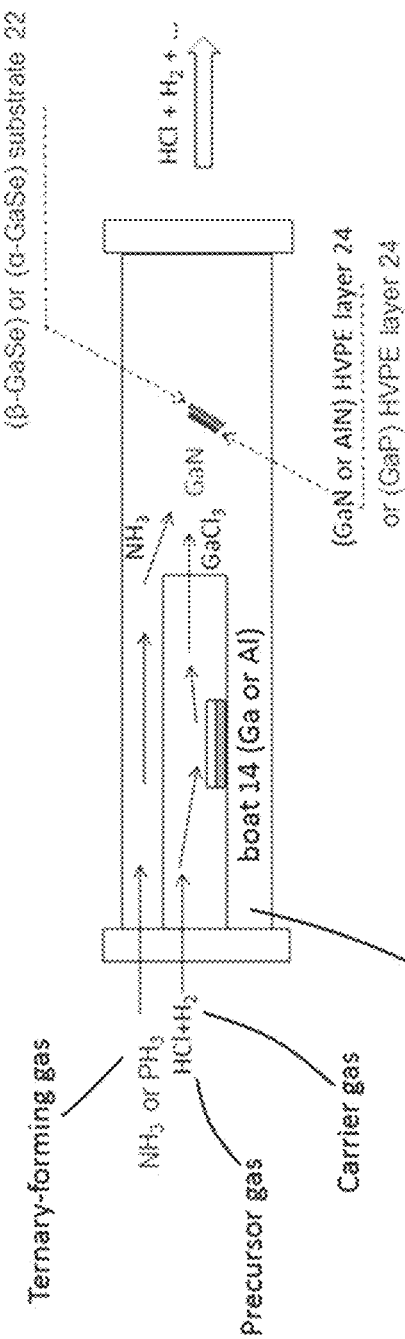
FIG. 10G illustrates a schematic drawing of an HVPE apparatus for optimized thick heteroepitaxial growth of GaN (or AlN) with in-situ pre-growth treatment of the hexagonal β-GaSe substrate or the template, or zinc blended GaP with in-situ pre-growth treatment of the α-GaSe substrate or the template, according to an embodiment of the invention.

With regard to FIG. 10G (the opposite cases of these presented on FIG. 10F), for the growth of GaN, the most probable chemical reactions are:

$$2Ga+6HCl \rightarrow 2GaCl_3+3H_2 \rightarrow GaCl_3+NH_3 \rightarrow GaN+ \\ 3HCl \qquad \text{(eq. 9a)}$$

For the growth of AlN, the most probable chemical reactions are:

$$2Al+6HCl \rightarrow 2AlCl_3+3H_2 \rightarrow AlCl_3+NH_3 \rightarrow AlN+3HCl \qquad \text{(eq. 9b)}$$

For the growth of GaP, the most probable chemical reactions are:

$$2Ga+6HCl \rightarrow 2GaCl_3+3H_2 \rightarrow GaCl_3+PH_3 \rightarrow GaP+3HCl \qquad \text{(eg. 9c)}$$

The chemistry in this case is the same as in the case presented in FIG. 10A (see also eq. 3).

In the first and third of these three examples the boat 14 is filled with gallium (Ga) while in the second example with aluminum (Al). Gas flow parameters for the growth of GaSe, GaSe, and AlN are similar to those presented in example 1 above. As one can see from the above examples, different materials (e.g. GaN, AlN, GaP) may be grown on different phases of the same material (α-GaSe and β-GaSe). This is another alternative variation of the proposed growth approach.

Example 5—Growth of GaAs on ZnSe Substrate

Figure 10H:
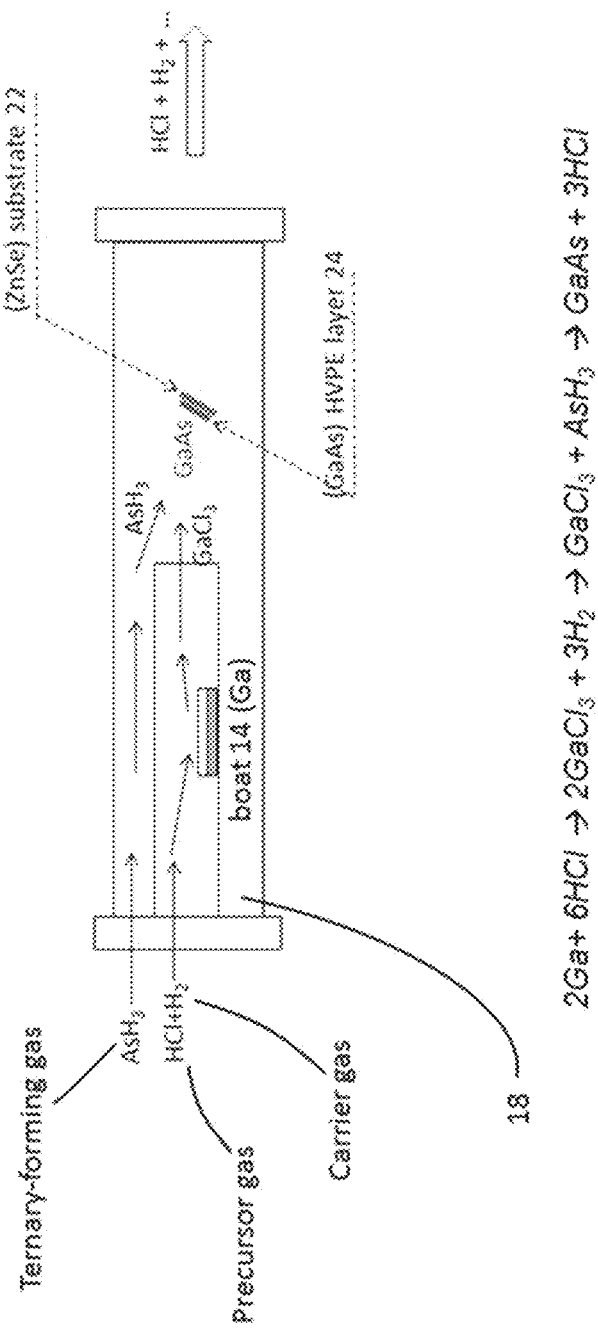
FIG. 10H illustrates a schematic drawing of an HVPE apparatus for optimized thick heteroepitaxial growth of GaAs with in-situ pre-growth treatment of the ZnSe substrate or the template, according to an embodiment of the invention.

This embodiment of the invention is based on hydride vapor phase epitaxy (HVPE) and the heteroepitaxial growth of GaAs on ZnSe substrates. As illustrated in FIG. 10H, the related experiments were conducted in a hot wall 3-inch diameter horizontal quartz reactor 10 positioned in a three-zone resistive furnace 12. A quartz boat 14 positioned in the first zone 16 and filled with molten gallium (Ga) was placed in a one-inch diameter inner tube 18 overflowed with a mixture of hydrogen H$_2$ as carrier gas and HCl (first precursor). The purpose of the H$_2$ is not only to carry the HCl but also to dilute the HCl flow to a desired extent while the HCl flow picks up some gallium (Ga) from the boat 14 to form gallium chloride (GaCl$_3$). Another peripheral growth, a mixture between hydrogen and hydrogen arsenide (AsH$_3$) (second precursor) in the case of GaAs growth is introduced in the reactor 10 to mix with the GaCl$_3$ in the second reactor zone 20, the "mixing zone", in order to react the mixture on the surface of the substrate 22 to form GaAs. The most probable chemical reactions related to forming GaAs is:

$$2Ga+6HCl \rightarrow 2GaCl_3+3H_2 \rightarrow GaCl_3+AsH_3 \rightarrow GaAs+ \\ 3HCl \qquad \text{(eq. 10)}$$

Gas flow parameters for the growth of GaAs are similar to those presented in example 1 above. One should bear in mind, however, that this case is less favorable than the opposite case of growth of ZnSe/GaAs (shown in FIG. 10C) because, in contrast to GaAs, ZnSe is mostly available in polycrystalline shape. In addition, OPZnSe templates are not commercially available at this time.

Other heteroepitaxial cases may be determined from FIG. 1. In general, the two materials selected will be as close as possible to each other along the horizontal axis (lattice constant), i.e. vertically-aligned. Such examples include, for example, AlAs with GaAs, CdS with InP, and other combinations that may be derived from FIG. 1 or in FIG. 13.

The general rule is to grow these distinct materials at small and, when possible, negative lattice mismatches, which is the case when the layer grows under tensile stress. This is considered as the more favorable condition because tensile strain in the growing layer compensates to some extent the naturally-compressed substrate surface.

Optimally, the substrate and the growing layer shall have small thermal mismatches, i.e. the two materials expand or shrink in response to heating or cooling at a similar extent with a similar rate. If the thermal mismatch is too great the growing layer, if it is thick enough, may crack. Though not limited to such an arrangement, it is more favored for the substrate to be a more mature material, i.e. with more mature techniques for growth, such as GaAs, GaP, GaSb, InP, InAs, GaN, etc., which are more readily commercially available at higher quality and at a reasonable price. Additional details regarding how to choose suitably compatible substrate materials and growing layer materials is presented in more detail further in the text.

Example 6—Growth of AlAs on GaAs Substrate

Figure 10I:
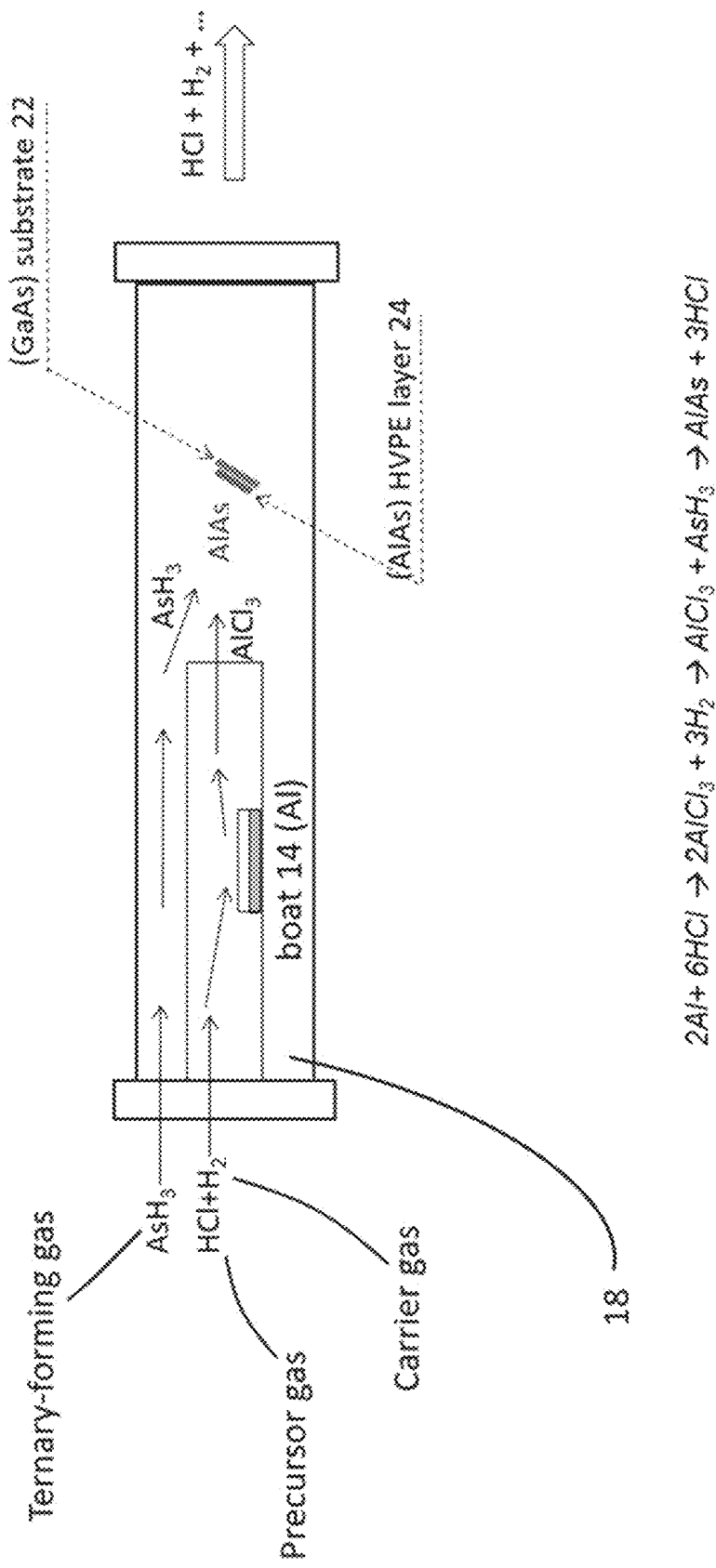
FIG. 10I illustrates a schematic drawing of an HVPE apparatus for optimized thick heteroepitaxial growth of AlAs with in-situ pre-growth treatment of the GaAs substrate or the template, according to an embodiment of the invention.

According to a further variation of the invention, the substrate is GaAs (gallium arsenide), the second precursor is AsH$_3$ (arsine), and the heteroepitaxial growth is AlAs (aluminum arsenide). This embodiment of the invention is based on hydride vapor phase epitaxy (HVPE) and the heteroepitaxial growth of AlAs on GaAs substrates. As illustrated in FIG. 10I, the related experiments were conducted in a hot wall 3-inch diameter horizontal quartz reactor 10 positioned in a three-zone resistive furnace 12. A quartz boat 14 positioned in the first zone 16 and filled with molten aluminum (Al) was placed in a one-inch diameter inner tube 18 overflowed with a mixture of hydrogen H$_2$ as carrier gas and HCl (first precursor). The purpose of the H$_2$ is not only to carry the HCl but also to dilute the HCl flow to a desired extent while the HCl flow picks up some aluminum (Al) from the boat 14 to form aluminum chloride (AlCl$_3$). Another peripheral growth, a mixture between hydrogen and hydrogen arsenide (AsH$_3$) (second precursor) in the case of AlAs growth is introduced in the reactor 10 to mix with the AlCl$_3$ in the second reactor zone 20, the "mixing zone", in order to react the mixture on the surface of the substrate 22 to form AlAs. The most probable chemical reactions related to forming AlAs is:

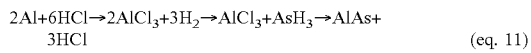

$$2Al + 6HCl \rightarrow 2AlCl_3 + 3H_2 \rightarrow AlCl_3 + AsH_3 \rightarrow AlAs + 3HCl \quad \text{(eq. 11)}$$

Gas flow parameters for the growth of AlAs are similar to those presented in example 1 above. There is a very small lattice mismatch between AlAs and GaAs: +0.13%. GaAs substrates are available at high quality and reasonable price. High quality orientation-patterned GaAs templates (OP-GaAs) are also available. However, AlAs substrates and OP templates are not commercially available, which makes the growth of GaAs on an AlAs substrate more difficult.

Example 7—Growth of InAs on GaSb Substrate

Figure 10J:
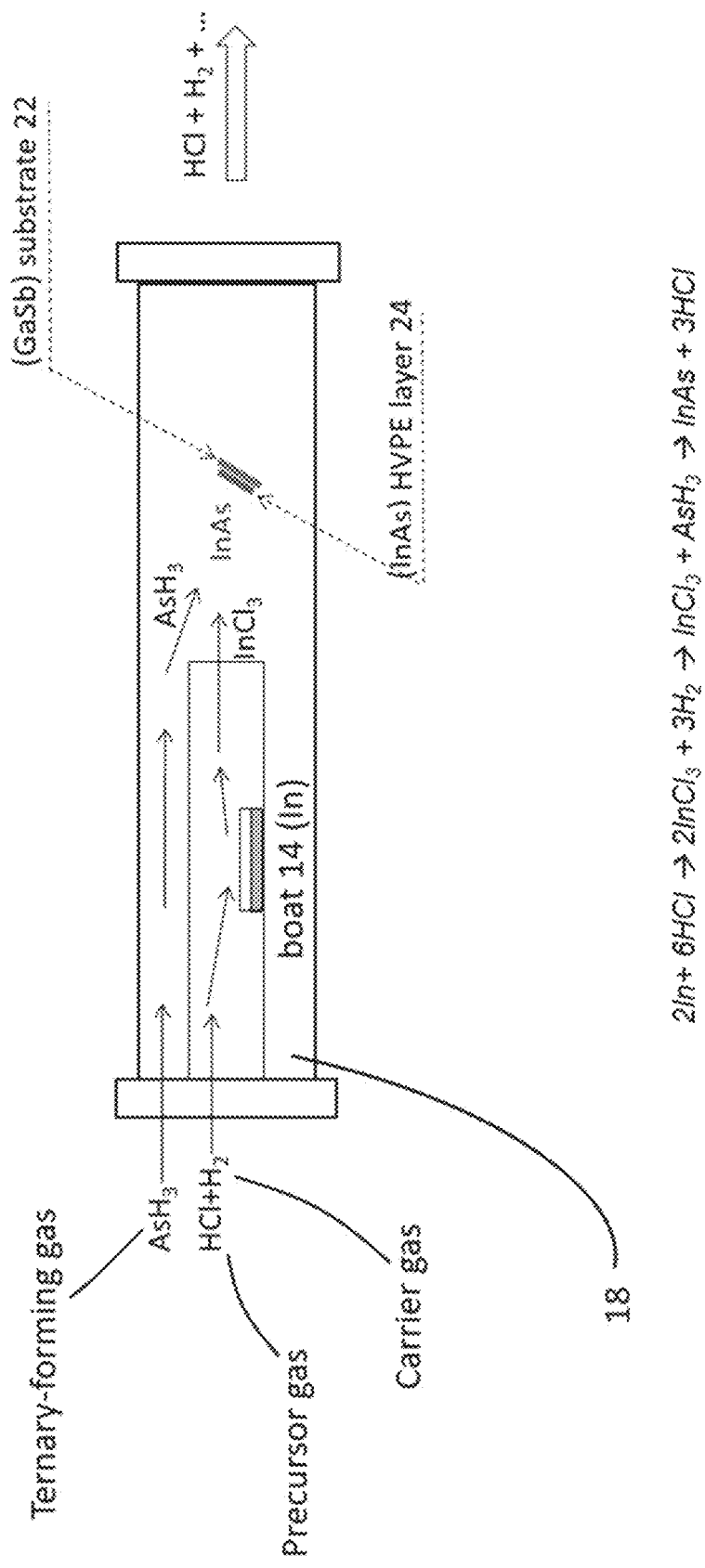
FIG. 10J illustrates a schematic drawing of an HVPE apparatus for optimized thick heteroepitaxial growth of InAs with in-situ pre-growth treatment of the GaSb substrate or the template, according to an embodiment of the invention.

According to another variation of the invention, the substrate is GaSb (gallium antimonide), the second precursor is AsH$_3$ (arsine), and the heteroepitaxial growth is InAs (indium arsenide). This embodiment of the invention is based on hydride vapor phase epitaxy (HVPE) and the heteroepitaxial growth of InAs on GaSb substrates. As illustrated in FIG. 10J, the related experiments were conducted in a hot wall 3-inch diameter horizontal quartz reactor 10 positioned in a three-zone resistive furnace 12. A quartz boat 14 positioned in the first zone 16 and filled with molten indium (In) was placed in a one-inch diameter inner tube 18 overflowed with a mixture of hydrogen H$_2$ as carrier gas and HCl (first precursor). The purpose of the H$_2$ is not only to carry the HCl but also to dilute the HCl flow to a desired extent while the HCl flow picks up some indium (In) from the boat 14 to form indium chloride (InCl$_3$). Another peripheral growth, a mixture between hydrogen and hydrogen arsenide (AsH$_3$) (second precursor) in the case of InAs growth is introduced in the reactor 10 to mix with the InCl$_3$ in the second reactor zone 20, the "mixing zone", in order to react the mixture on the surface of the substrate 22 to form InAs. The most probable chemical reactions related to forming InAs is:

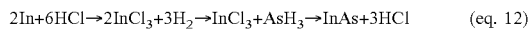

$$2In + 6HCl \rightarrow 2InCl_3 + 3H_2 \rightarrow InCl_3 + AsH_3 \rightarrow InAs + 3HCl \quad \text{(eq. 12)}$$

Gas flow parameters for the growth of InAs are similar to those presented in example 1 above. There is a very small lattice mismatch between InAs and GaSb: −0.61%. The availability of both GaSb and InAs substrates make the presented InAs/GaSb growth and its opposite growth of GaAs/InP possible, although orientation-patterned templates (OPGaSb nor OPInAs) are not currently available.

Without being bound by theory, during heteroepitaxy the relation between the forces that keep the atoms of the substrate in place and the atoms of the growing layer, $\Psi_{AA}$ and $\Psi_{BB}$ from one side and the interfacial force $\Psi_{AB}$ from the other side is important. Thus, in the case when $\Psi_{AB} \gg \Psi_{BB}$ and $\Psi_{AB} \cong \Psi_{AA}$ the interfacial force $\Psi_{AB}$ is strong enough to produce the pseudomorphous growth. As a result, during pseudomorphous growth the lattice of the growing crystal B (e.g. GaP) will be, initially, homogeneously strained to fit to the lattice of the substrate crystal A (e.g. GaAs), which occurs at the expense of a linearly-increasing elastic strain. This, depending reciprocally on how large the lattice mismatch is, may typically continue to the deposition of no more than about 10-15 monoatomic layers. After this critical thickness h$_c$ (the thickness of the pseudomorphous growth), according to the misfit dislocation (MDs) concept, the pseudomorphous growth will become energetically unfavorable and the homogeneous strain will be released in the formation (in the ideal case) of MDs with a periodicity $\tau$ that should depend on the difference between the two lattice constants a$_0$-b$_0$. (Note: Interfacial force is the force across the interface between two phases that keep them together.)

Figure 11:
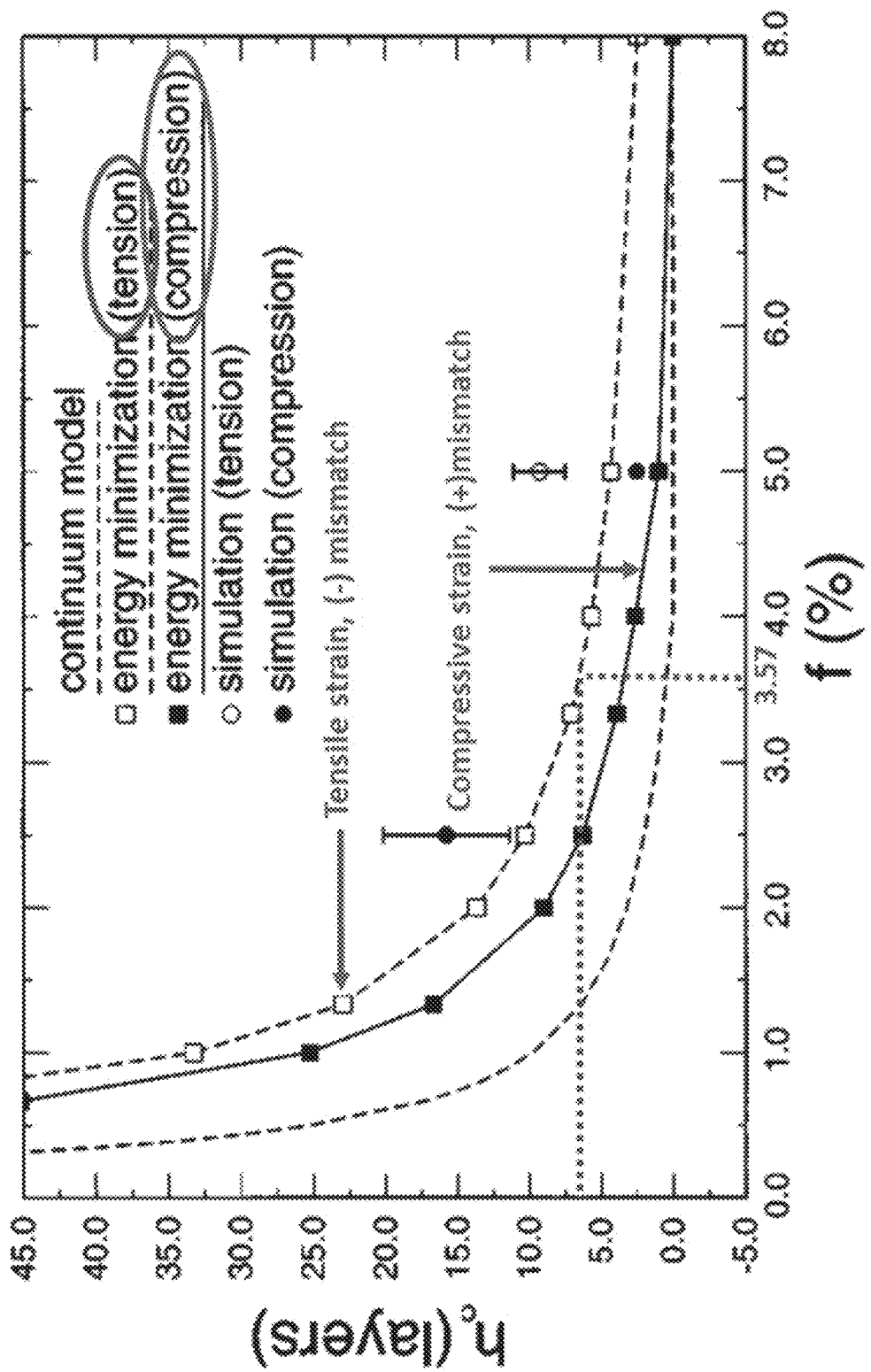
FIG. 11 depicts the thickness of the pseudomorphous growth (the critical thickness $h_c$) expressed as the number of monoatomic layers as a function of the lattice mismatch.
Figure 12A:
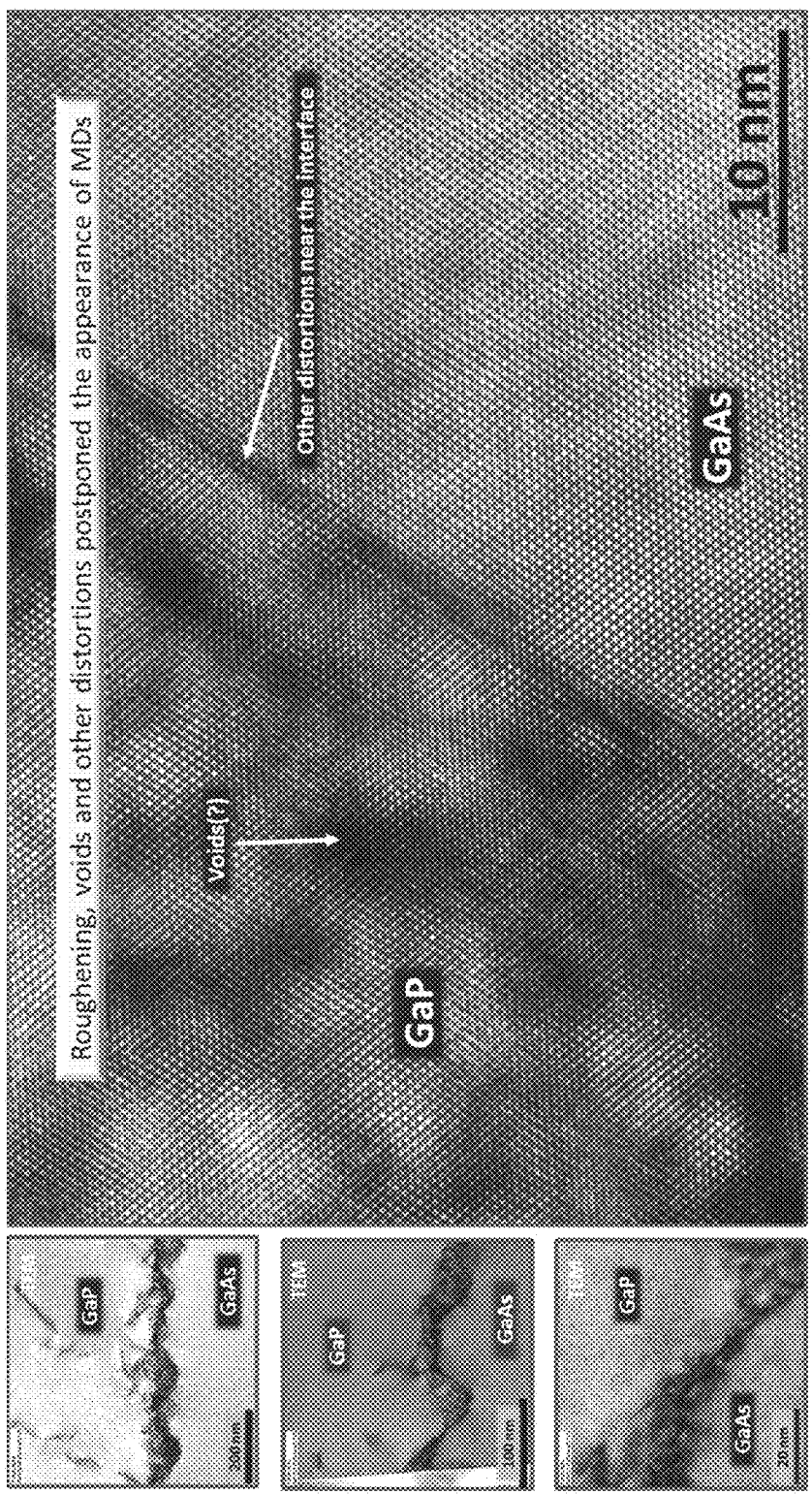
FIGS. 12A, 12B, and 12C depict TEM cross sectional images with increasing magnification showing rough surface interface between the growing GaP layer and the GaAs substrate.
Figure 12B:
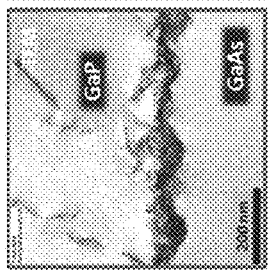
Figure 12C:
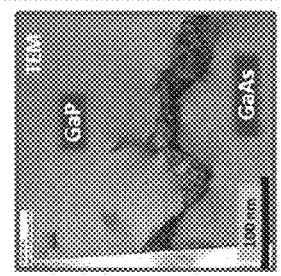
Figure 12D:
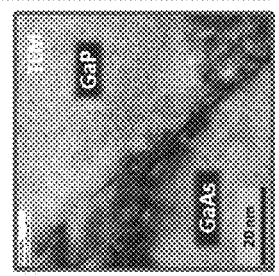
FIG. 12D depicts that distortions of different kind, such as creating of voids or roughening of surfaces near the interface make difficult to determine the thickness of the pseudomorphous growth $h_c$ and the periodicity τ of the MDs.

The critical thickness h$_c$, in general, increases with the decrease of the lattice mismatch, but does not depend linearly on the linearly-increasing elastic strain. Many other factors, such as the sign of the lattice mismatch, the mechanisms of MD formation, etc., must be considered to determine this thickness. These factors have been incorporated into several models related to stress relaxation and misfit dislocation nucleation. Taking into account the sign and the degree of the lattice mismatch between GaP and GaAs (−3.57%), and the previously-determined periodicity $\tau$ of the MDs (about 28 interatomic distances) it was attempted, theoretically (using FIG. 11), to determine the expected thickness of the pseudomorphous growth h$_c$. FIG. 11 illustrates the critical thickness h$_c$ as a function of the misfit f. The upper dashed curve with the open squares is obtained by energy minimization with a continuum model (the lower dashed curve) and is correlated to a negative (tensile) misfit. The solid curve with the solid squares is obtained by minimization of the atomistic model for positive (compressive) misfit. The two solid circles are the MD simulation results for positive (compressive) misfit of f=+2.5% and f=+5.0%, while the open circle is the simulation result for f=−5.0% negative (tensile) misfit. (Note: that the error bar for the +5.0 compressive misfit is smaller than the size of the solid circle symbol and that is why does not appear in the figure.) The arrows show the case of GaP/GaAs at a negative misfit of −3.57%. Thus one can easily see that at the negative misfit of −3.57%, when the GaP grows tensile-strained on the GaAs substrate, the critical thickness must be in the range of 5-10 monoatomic layers after which the MDs shall start to appear with a periodicity $\tau$ (according to eq. 2) of about 28 monoatomic distances. After such a rough estimation we tried to determine h$_c$ and $\tau$ using high magnification TEM cross sectional images of areas near the interface between the GaAs substrate and the HVPE grown GaP layer (see FIG. 12) by looking for interruptions in the regular lines of atoms parallel and perpendicular to the interface directions.

It was determined that the formation of MD's may be postponed by relaxing the strain through other strain relief mechanisms, such as roughening of surfaces or formation of other non-uniformities (voids, etc.) near the interface, indicated by the contrast fluctuations (see the arrows on FIG. 12). These fluctuations may be caused by voids, local stress, or compositional variations. We should also bear in mind that all theoretical works and simulations (such as those graphically expressed in FIG. 11) assume a flat interface and typically predict smaller critical thicknesses than those determined in experimental studies. There are mechanisms other than the formation of dislocations for releasing the strain accumulated as a result of the lattice and thermal mismatches that are thought to be associated with the layer roughness. For example, the formation of voids, above which the average tensile hydrostatic stress is lower, or the formation of free surface due to roughening, may also reduce the strain and thus contribute to postponing the formation of MDs and increasing the critical layer thickness. The lattice mismatch strain may also be accommodated by 90° MDs that are parallel to the interface, rendering them invisible on the cross sectional TEM images. Another possibility is that the interfacial force $\Psi_{AB}$ is not strong enough to produce pseudomorphous growth, or that the P atoms replacing some of the As atoms in the GaAs crystal (forming GaAsP) cell, actually, diminish the need for a pseudomorphous growth. The above considerations concern HVPE growth techniques in which the nature of its fast growth is "seeking" mechanisms for fast relief of the fast building strain. This makes postponing the appearance of MDs for the later stages of the growth not that surprising.

Characterizations

Each pretreated or grown sample was characterized with regard to its surface morphology and crystalline and optical quality by at least several of the following characterization techniques: cross section and top layer surface Nomarski optical imaging, x-ray diffraction (XRD), scanning electron microscopy (SEM), atomic force microscopy (AFM), tunnel electron microscopy (TEM), electron dispersion spectroscopy (EDS), optical transmission, and linear and nonlinear optical absorption. Each of these characterizations was performed in order to reveal the mechanisms of formation of defects near the interface between the substrate and the growing layer, and also how these defects propagate in the layer and how they impact the final layer quality, taking into account the impact of the applied pretreatment conditions and the applied growth parameters during the growth stage.

Characterizations related to the surface morphology, the crystalline layer quality, and other electrical an optical parameters related to some specific practical application were used also as feedback to the growth process that allowed the determination of the optimal parameters for pretreating and growth, e.g. substrate and mixing zone temperatures and the rates of their change, reactor pressure, V-III ratios, gas flow regimes, etc., for a number material cases.

From the dark field TEM images of GaP grown on GaAs sample (see FIG. 2B) it was confirmed that, as it was predicted (see FIG. 2A), the biaxial strain a during growth of GaP/GaAs can be resolved into a uniaxial shear stress $\tau$ on the (111) dislocation glide plane. As a result, edge, screw, and mixed dislocations do appear along the (111) zone; as in the case of a Burger vector $G=00\bar{2}$ both edge and mix dislocations are observed, while in the case of $G=002$ screw and mix dislocations are observable (see FIG. 2B). The good news is that after the first 1-2 μm of growth, which are highly populated with dislocations, the dislocation density starts to noticeably decrease with the layer thickness. Thus, as our cross section linear transmission measurements indicated, in the next couple of hundreds of microns the material demonstrates good IR transparency, which allowed its usage for the intended frequency conversion applications. Finally, the growing layer is terminated by a smooth top surface morphology with an average roughness RMS <1 nm for a 1 μm² AFM scanning spot. Such a self-healing effect has been noticed during the HVPE growth of some other semiconductor materials too, for example in the case of HVPE grown on GaN.

Our measurements indicate that we have determined good control parameters for engineering of the transition buffer layer, particularly with regard to its thickness, composition, and quality which allows a smooth transition between two mismatched materials.

We demonstrated that extending the idea of the transition buffer layer to the growth of a thick ternary layer we were able to achieve hundreds of micron thick $GaAs_xP_{1-x}$ at different composition and characteristics that combine the best nonlinear properties of the two parenting materials—in this case, the higher nonlinear susceptibility of GaAs with the lower 2PA of GaP. An example is $GaAs_{0.34}P_{0.66}$. Thus ternaries may be a good solution for both device development and improved heteroepitaxial growth at lower lattice mismatches.

By demonstrating that heteroepitaxy is possible and successful in some less favorable cases (GaP/GaAs and GaAs/GaP) we have opened widely the doors for other heteroepitaxial cases (ZnSe/GaAs, ZnTe/GaSb, ZnTe/InAs, AlAs/GaAs and even GaP/Si) that provide closer, more favorable lattice and thermal matches. The first in this line, ZnSe was already successfully grown by our technique in a large size (quarters of 2-inch wafers) with high crystalline quality (FWHM ~ 60 arcsec) and 70 μm thickness in a 1-hour growth experiment on a GaAs substrate. This provides an example of the power of the proposed heteroepitaxial approach because, to date, all commercially-available ZnSe substrates are polycrystalline.

According to FIGS. 1 and 13, there are a number of other favorable heteroepitaxial cases that may be determined by the lattice mismatch between the substrate and the growing layer. Such cases include, for example, CdS/InP (−0.624% lattice mismatch), or vice-versa, i.e. InP/CdS (+0.624% lattice mismatch), AlSb/GaSb (+0.650% lattice mismatch), CdSe/InAs (−0.139% lattice mismatch), GaSb/InAs (+0.620% lattice mismatch), AlSb/InAs (+1.273% lattice mismatch), CdTe/InSb (+0.040% lattice mismatch), InSb/CdTe (−0.040% lattice mismatch), HgTe/CdTe (−0.447% lattice mismatch), HgTe/InSb (−0.407% lattice mismatch), or even CdS/ZnS (−7.064% lattice mismatch). Although the latter mismatch (CdS/ZnS) might be considered as large, there are a number of techniques and growth modes that can make heteroepitaxy possible even in such cases. A great example of that is, for instance, the growth of GaN on sapphire, where the lattice mismatch is huge, −33.354%.

As one can see in point of view of lattice mismatch all other suggested in FIG. 13 heteroepitaxial cases are more favorable than the first realized case—GaP/GaAs (−3.574% lattice mismatch), which is a good precondition for their success. This was partly proven by successfully realizing the next heteroepitaxial case, ZnSe/GaAs (only +0.238% lattice mismatch). However, even at larger than those lattice mismatches, there are a number of techniques and growth modes that can make heteroepitaxy possible even in such less favorable cases.

In one of the example in FIG. 13 (InSe) a substrate material is not specified. This is because there are some contradictions in the literature in regards to the InSe crystal structure and lattice constants. Plus, InSe is a typical 2D material. Such materials can be grown on various substrates as far as they are held to the substrate only by van der Waals (VDW) forces, a case when the lattice mismatch is not as important as opposed to the other cases discussed above. Namely, due to this weak interaction the epi-layer, which grows from the very beginning with its own lattice constant, forms an interface with the substrate, the interface has an extremely small number of defects. That is why during VDW heteroepitaxy the layer is drastically relaxed which allows a large variety of different heterostructures, even for highly lattice-mismatched systems. Thus, the proposed approach not only gives not only the opportunity to heteroepitaxially grow numerous other 2D van der Waals semiconductor materials, such as elemental 2D semiconductors, chalcogenides, phosphides, arsenides, iodides, and oxides, but also offers the possibility to combine 3D materials with large lattice mismatches by introducing a buffer layer of a 2D crystal for many cases. This is another important alternative variation of this technique.

As taught above, however, the lattice mismatch is not the only important criterion when matching two materials in a growth process. First of all, to be practical, the substrate material should be available in a relatively large size (e.g. 2-inch wafers), at a reasonable price and with high crystalline quality. The availability of such substrates indicates a mature growth and preparation technology. Next to the well-known, common substrates, e.g. Si, Ge, GaAs, or GaP, some other materials, e.g. InAs, InP, InSb, GaSb, and CdTe are also available as substrates for subsequent epitaxial growth. It makes sense to grow materials that are either more expensive or not available in large size with crystalline quality, e.g. ZnSe or ZnTe, on common or high quality substrates, e.g. growth of crystalline ZnSe/GaAs or ZnTe/GaSb. In the same way, it is much more reasonable to grow CdSe, which is also not available as large crystalline substrates, on InAs, which is available at high quality and at a fairly reasonable price of about $100 per 2-inch wafer. Similarly, it is preferable to grow CdS (about $2,000 per 2" wafer) on the cheaper InP (about $400 per 2-inch wafer) than to perform the opposite growth, i.e. InP/CdS. Also to be considered are the growths of zinc blende materials (for example GaP) on zinc blende substrates (for example GaAs), or wurtzite materials (for example GaN) on wurtzite substrates (for example sapphire) rather than zinc blende materials with cubic symmetry on wurtzite substrates with hexagonal symmetry. One also should bear in mind that different crystallographic orientations may provide a closer lattice match to different phases of one material. Thus hexagonal GaN may be successfully grown on (111) GaAs substrates, while cubical GaN may be grown on (100) GaAs. The opposite condition, i.e. that two different phases of the same material may be grow successfully on completely different materials. Thus, as described above, α-GaSe can be grown on GaP, while β-GaSe can be grown on GaN (see also FIG. 13). To simplify the chemistry, it may also be preferable to grow antimonide on antimonide, or selenide on selenide than, for example, antimonide on sulfide, even if this is at the expense of a larger lattice mismatch. Thus, for example, the case AlSb/GaSb should be preferred to the case of CdSe/InAs. However, this as many other recommendations presented here, shall not be accepted as strict rules because there are cases when growth on the same type of compound may result in lower surface quality and a larger number of misfit and treading dislocations. Some examples: InAs on GaSb have much smaller lattice mismatch (−0.615%) than InAs/GaAs (+7.165% lattice mismatch), or CdSe/InAs (−0.139% lattice mismatch) even though they are semiconductors from different (II-VI and III-V) groups.

One should also bear in mind that, as described above, that from a crystallographic point of view, growth at a negative mismatch that results in a tensile strained growing layer is more favorable than growth performed at a positive mismatch, i.e. under compressive strain. One explanation of such a preference is that a tensile growing layer can to some extent compensate for the naturally-compressed substrate surface, as well as the fact that tensile growth provides conditions that are more favorable for 2D (layer) growth when the growth results in thicker pseudomorphous growth. In contrast, when the growth occurs under compressive strain, the conditions favor 3D (island) growth, which results in rougher surface morphology. That is why, for example, growth of CdS/InP (−0.624% lattice mismatch) should be preferred to growth of InP/CdS (the same but positive, +0.624%, lattice mismatch.

It should also be remembered that the thermal mismatch between the growing layer and the substrate, i.e. the difference between the thermal expansion coefficients and their thermal conductivities, starts to play a more and more important role with increasing the layer thickness, which can lead to cracking of the growing layer. For example, the 3 times smaller thermal conductivity of ZnSe (18 W.m-1K-1) should probably be taken into account when growing thick ZnSe on GaAs.

Although that the best ternary for the buffer layer should be the one that is formed by the two parenting materials (for example, GaAsP buffer material for GaP/GaAs or GaAs/GaP growths) we should also consider that one growing material can be fit to the substrate by using a buffer layer formed from a third material having a lattice constant between those of the substrate and the growing layer. For example, GaSb was grown by MBE on GaAs by using not only GaSb, but also InAs or AlSb buffer layers. Notice that the growth technique is this example (MBE) is different from the method described above (HVPE). Multiple buffer layers and multiple materials may be used to provide for a gradual transition between two completely incompatible materials. A convincing example is the growth of InSb on a GaAs substrate. The first step is to grow an intermediate layer of InP (lattice constant 5.8668 Å) on the GaAs substrate (lattice constant 5.6533 Å). Next is the growth of a second intermediate layer (GaSb-lattice constant 6.0959 Å). Next is to grow a third intermediate layer (ZnTe-lattice constant 6.1010 Å) on the second GaSb intermediate layer, and to finish with a thick growth of InSb (lattice constant 6.4794 Å).

Of course, the success of such efforts will be greatly improved if the intermediate layers are grown in mixtures of the related precursors (in the case of the first InP/GaAs transition, an $AsH_3+PH_3$ mixture in the presence of Ga and In overflowed by HCl), which will support the growth of ternary or quaternary intermediate layers with a gradually-changing composition, ensuring a smooth transition between the two materials. Thus materials that are completely incompatible may be grown on each other, even with differences in the lattice constants of 10 Å or more.

In summary, the major criteria for choosing a substrate and growing material pair are:
1. The magnitude and the sigh of the lattice mismatch
2. The maturity of the substrate growth and template preparation technology
3. The price and the quality of the available substrates and growing layer
4. The crystallographic structure/symmetry and the chemical bonds of the substrate and the growing layer
5. The difference in the thermal expansion coefficients and the thermal conductivity of the substrate and the growing layer.
6. The toxicity and flammability of the used chemicals.

Precursor Gases and Ternary-Forming Gases

The first precursor gas is usually hydrogen chloride (HCl) diluted to the desired extent by the carrier gas (usually $H_2$). The role of the precursor gas is to pick-up a II or III group element (e.g. Ga, Al, Sb, Cd) from an open boat or a bubbler, and with it to form a metal-chlorine compound, called "precursor" which is delivered to the mixing zone, making it available to participate in the growing process.

The ternary-forming gas, i.e. second precursor gasses, is usually a hydride of a V or VI group element ($AsH_3$, $PH_3$, $H_2S$, $SbH_3$, etc.) diluted to the desired extent by the carrier gas (usually $H_2$). The role of the ternary-forming gas, which is actually the precursor of the V or VI-group element, is to be delivered to the mixing zone, making it available to participate in the growing process. We call this precursor "ternary-forming" because the reactions between the precursor gas and the ternary-forming gas on the foreign substrate may result in the formation of ternary islands which eventually coalescence, forming a continuous ternary buffer layer.

Alternative names: The precursor gas may be called "precursor of the II or III-group element" or "first precursor". The ternary-forming gas may be called "precursor of the V or VI-group element" or "second precursor".

We reserve the right to use the same names for mixtures from the related precursors.

By demonstrating that heteroepitaxy is possible and successful at larger lattice mismatches without using a patterned template in one step growth process (preceded by substrate pre-growth pretreatment) we have eliminated the need for growth on patterned substrates at larger mismatches, or the preliminary deposition of a thin MOCVD or MBE layer, or even the HVPE deposition of a LT lower quality buffer layer. The disclosed parameters of heteroepitaxy, e.g. the thickness of the pseudomorphous growth and periodicity of the misfit dislocations, for some particular cases have established clear criteria by which additional cases of heteroepitaxy may be deemed favorable.

The invention described herein is an innovative approach for pre-growth in-situ treatment of a substrate and the subsequent optimized thick HVPE heteroepitaxial growth on the substrate as a continuation of the pretreatment. The inventive approach applies discovered process parameters that secure a smooth transition between two different materials and the process is flexible enough to adapt these parameters even at relatively large lattice and thermal mismatches. The evidence provided herein regarding the successful heteroepitaxial growth of materials which are disfavored according to the known prior art supports the application of the inventive process over a wide range of semiconductor pairs having differing degrees of lattice or thermal mismatch.

As mentioned above, the invention consists broadly of two steps: (1) pre-growth treatment of the substrate in order to initiate the replacement of V-group atoms of the substrate with V-group atoms of the layer intended to be grown, and (2) heteroepitaxial growth on the pretreated substrate. The proposed approach allow plenty of opportunity for applying different process parameters, using different temperatures, start times, durations, flow rates, etc. The invention allows one to freely adjust the process parameters and to accommodate materials to each other.

The expectations are that the proposed approach will have an instant impact on several different R & D areas such as development of frequency conversion laser sources, the solar cell industry, and in optoelectronics. Each of these areas will facilitate the developments of more specific subareas. For example, the development of new frequency conversion laser sources may result in a great number of military (IR countermeasures, laser radar, IR communications) and civilian applications in areas such as security (new type airport scanners, remote sensing of explosives or biological agents), environment protection (UV water purification), energy conservation (LED), high energy physics (high power lasers with use, for example, in nuclear synthesis), industry, medicine, and science. Similarly, developments of optoelectronics will have a strong impact on development of all-optically-communicating devices, as well developments in the solar cell industry based on heteroepitaxy can give us a better chance for development of multilayer, multiphoton, portable solar cells, or new multicolor detectors that cover large spectral ranges, including both atmospheric windows of transparency, etc.

Alternative Variations:
1. Growths on different crystallographic orientations may provide closer lattice match to different phases of one and the same material.
Examples: Hexagonal GaN can be successfully grown on (111) GaAs substrates, while cubic GaN can be grown on (100) GaAs.
2. Two different phases of the same material can grow successfully on completely different materials.
Examples: α-GaSe can be grown on GaP substrates while β-GaSe may be grown on GaN substrates (see also FIG. 13).
3. A buffer layer comprising a third material that has a lattice constant between those of the substrate and the growing layer.
Examples: GaSb can be grown on GaAs by using not only GaSb, but also InAs or AlSb buffer layers.
4. Multiple buffer layers from multiple distinct materials for a gentle and gradual transition between two completely incompatible materials.
Examples: Grow first an intermediate InP layer (lattice constant 5.8668 Å) on a GaAs substrate (lattice constant 5.6533 Å); continue with the growth of a second (GaSb) intermediate layer (lattice constant 6.0959 Å); grow a third ZnTe intermediate layer (lattice constant 6.1010 Å) on the second GaAs intermediate layer, and finish with a thick growth of InSb (lattice constant 6.4794 Å).
5. Heteroepitaxial growth of 2D van der Waals semiconductor materials.
Examples: elemental 2D semiconductors, InSe and other selenides, phosphides, arsenides, iodides, oxides, and chalcogenides.
6. The proposed approach is applicable not only for III-V compounds (e.g. GaAs, InAs, AlAs, GaSb, InSb, AlSb, GaP, InP, GaN, AlN, etc.) but also for II-VI (e.g. ZnSe, CdSe, CdTe, HgTe, ZnTe, CdS, etc.) and even III-VI (GaSe, InSe, GaTe) or II-V (ZnSe) semiconductor compounds. At the same time it is not a strict rule to grow one group's materials on substrates from the same group (e.g. a III-V group material on a III-V group substrate, etc.) because mixed cases may be more favorable—for, instance, the case of the already realized case of ZnSe (II-VI group) grown heteroepitaxially on the III-V group GaAs substrate.
7. The combination of one close-to-equilibrium growth technique (HVPE) with one far-from-equilibrium growth technique (MBE, MOCVD), makes it possible to grow heterostructures which appear impossible according to the prior art, including growths on common substrates, such as Si or Ge.
Examples: 1) Growth can start with thin MOCVD or MBE growth of GaP on Si and continue with thick HVPE growth of GaP on the GaP intermediate layer, which may be continued with thick HVPE growth of GaAs on the HVPE GaP layer, and then continued further with thick HVPE growth of ZnSe on the HVPE grown GaAs, etc.;
2) Growth can start with thin MOCVD or MBE growth of GaAs on Ge and continued with thick HVPE growth of GaAs on the GaAs intermediate layer, which may be continued with thick HVPE growth of GaP on the HVPE GaAs layer, and then continued further with thick HVPE growth of α-GaSe on the HVPE grown GaP, etc.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of performing heteroepitaxy, comprising:
exposing a substrate to
   a carrier gas,
   a first precursor gas,
   a Group II/III element, and
   a second precursor gas, to form a heteroepitaxial growth of β-GaSe (gallium selenide) on the substrate;
wherein the substrate comprises GaN;
wherein the carrier gas is $H_2$,
wherein the first precursor is HCl,
the Group II/III element comprises Ga; and
wherein the second precursor is $H_2Se$ (hydrogen selenide).

2. A method of performing heteroepitaxy, comprising:
exposing a substrate to
   a carrier gas,
   a first precursor gas,
   a Group II/III element, and
   a second precursor gas, to form a heteroepitaxial growth of β-GaSe (gallium selenide) on the substrate;
wherein the substrate comprises AlN;
wherein the carrier gas is $H_2$,
wherein the first precursor is HCl,
the Group II/III element comprises Ga; and
wherein the second precursor is $H_2Se$ (hydrogen selenide).

* * * * *